United States Patent
Tanaka et al.

(10) Patent No.: US 8,338,882 B2
(45) Date of Patent: Dec. 25, 2012

(54) SEMICONDUCTOR MEMORY DEVICE AND METHOD FOR MANUFACTURING SAME

(75) Inventors: Hiroyasu Tanaka, Mie-ken (JP); Ryota Katsumata, Mie-ken (JP); Masaru Kito, Kanagawa-ken (JP); Yoshiaki Fukuzumi, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 12/841,662

(22) Filed: Jul. 22, 2010

(65) Prior Publication Data

US 2011/0220987 A1 Sep. 15, 2011

(30) Foreign Application Priority Data

Mar. 10, 2010 (JP) ................................. 2010-052887

(51) Int. Cl.
*H01L 29/792* (2006.01)

(52) U.S. Cl. .... 257/324; 257/326; 257/329; 365/185.17

(58) Field of Classification Search .................. 257/324, 257/326, 329; 365/185.17
See application file for complete search history.

(56) References Cited

U.S. PATENT DOCUMENTS

| | | | |
|---|---|---|---|
| 2007/0159878 A1* | 7/2007 | Choi et al. | 365/163 |
| 2007/0252201 A1 | 11/2007 | Kito et al. | |
| 2008/0173928 A1* | 7/2008 | Arai et al. | 257/316 |

FOREIGN PATENT DOCUMENTS

| | | |
|---|---|---|
| JP | 2007-266143 | 10/2007 |
| JP | 2008-72051 | 3/2008 |
| JP | 2009-146954 | 7/2009 |
| JP | 2009-224612 | 10/2009 |
| JP | 2009-267243 | 11/2009 |
| WO | WO 2009/057277 A1 | 5/2009 |
| WO | WO 2009/075370 A1 | 6/2009 |

OTHER PUBLICATIONS

U.S. Appl. No. 12/679,991, filed Mar. 25, 2010, Yoshiaki Fukuzumi et al.
Japanese Office Action issued on Aug. 13, 2012, in Japanese Patent Application No. 2010-052887 filed Mar. 10, 2010 (with English Translation).

* cited by examiner

*Primary Examiner* — Long Tran
(74) *Attorney, Agent, or Firm* — Oblon, Spivak, McClelland, Maier & Neustadt, L.L.P.

(57) ABSTRACT

According to one embodiment, a semiconductor memory device includes a base, a stacked body, a memory film, a channel body, an interconnection, and a contact plug. The base includes a substrate and a peripheral circuit formed on a surface of the substrate. The stacked body includes a plurality of conductive layers and a plurality of insulating layers alternately stacked above the base. The memory film is provided on an inner wall of a memory hole punched through the stacked body to reach a lowermost layer of the conductive layers. The memory film includes a charge storage film. The interconnection is provided below the stacked body. The interconnection electrically connects the lowermost layer of the conductive layers in an interconnection region laid out on an outside of a memory cell array region and the peripheral circuit. The contact plug pierces the stacked body in the interconnection region to reach the lowermost layer of the conductive layers in the interconnection region.

11 Claims, 22 Drawing Sheets

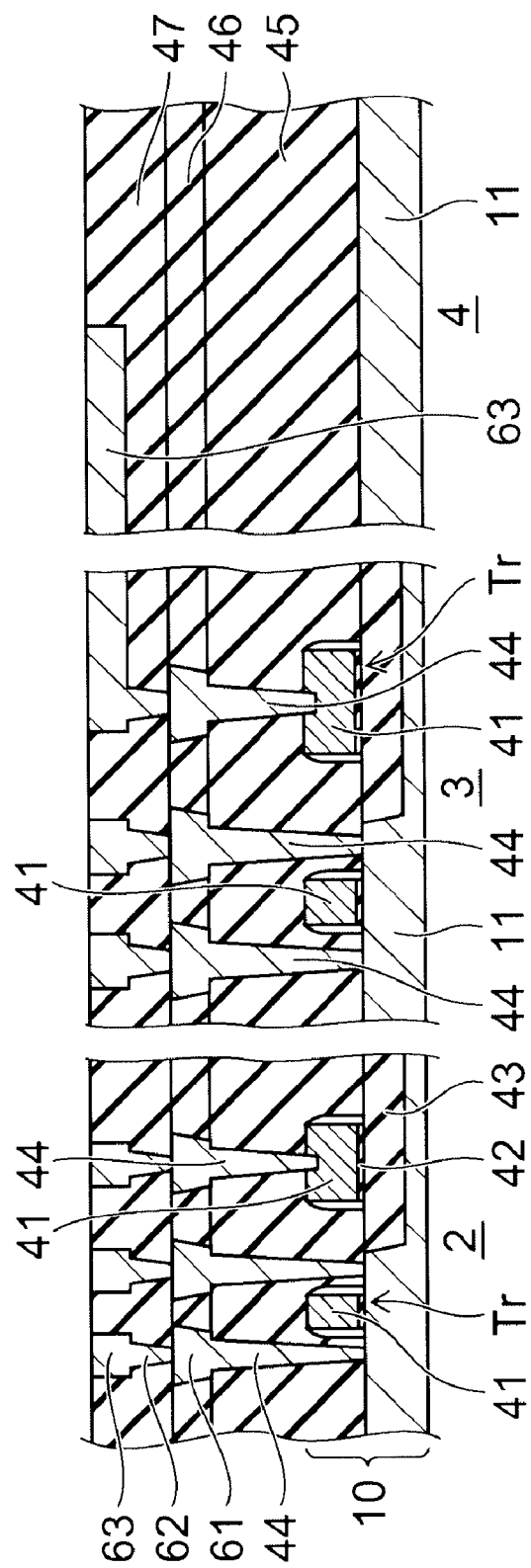

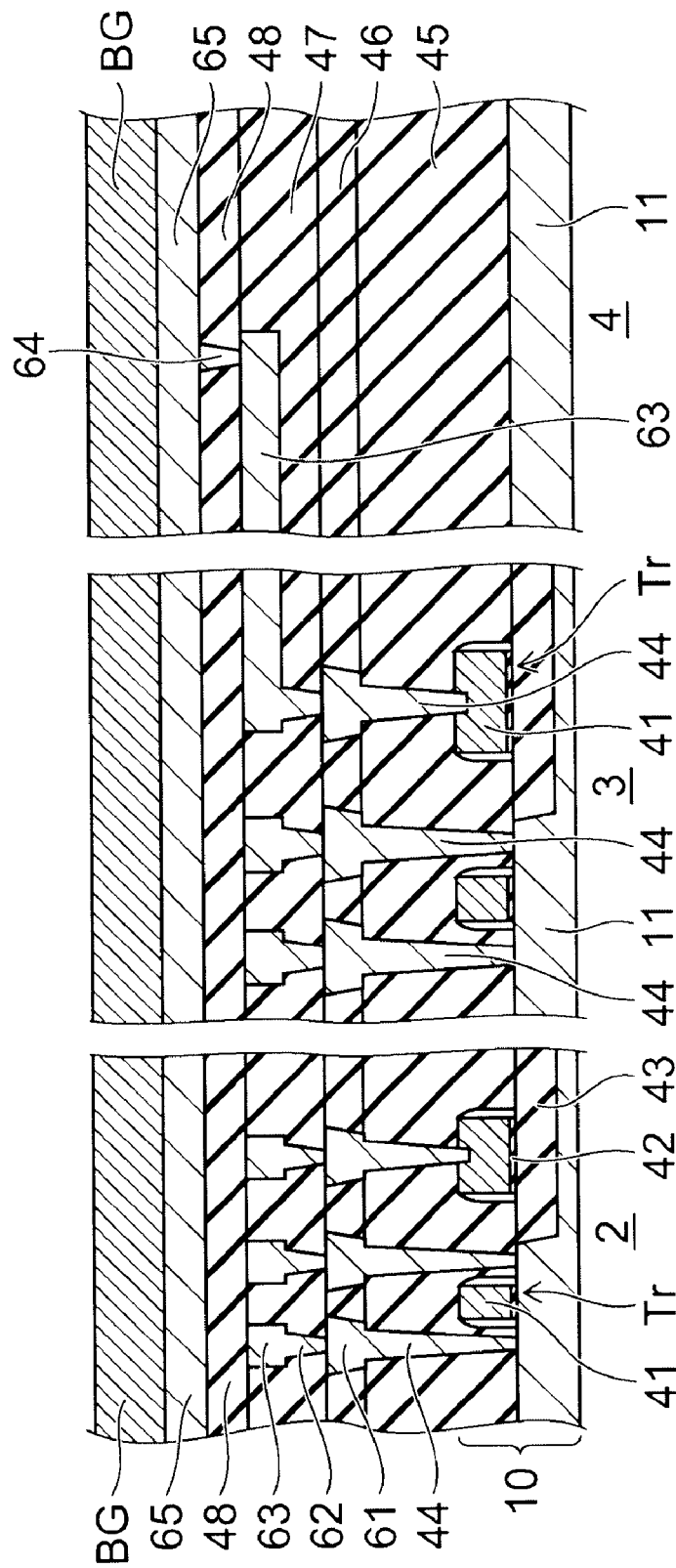

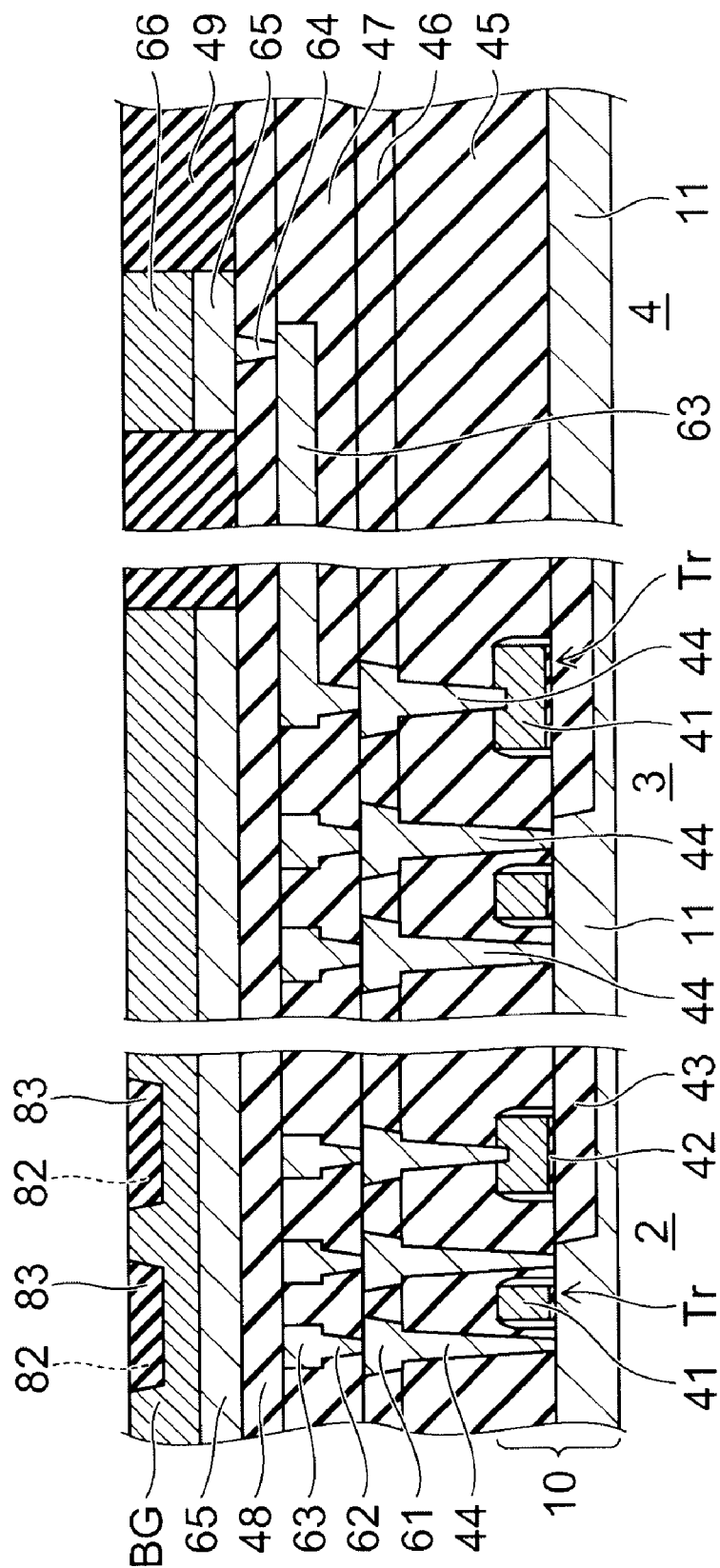

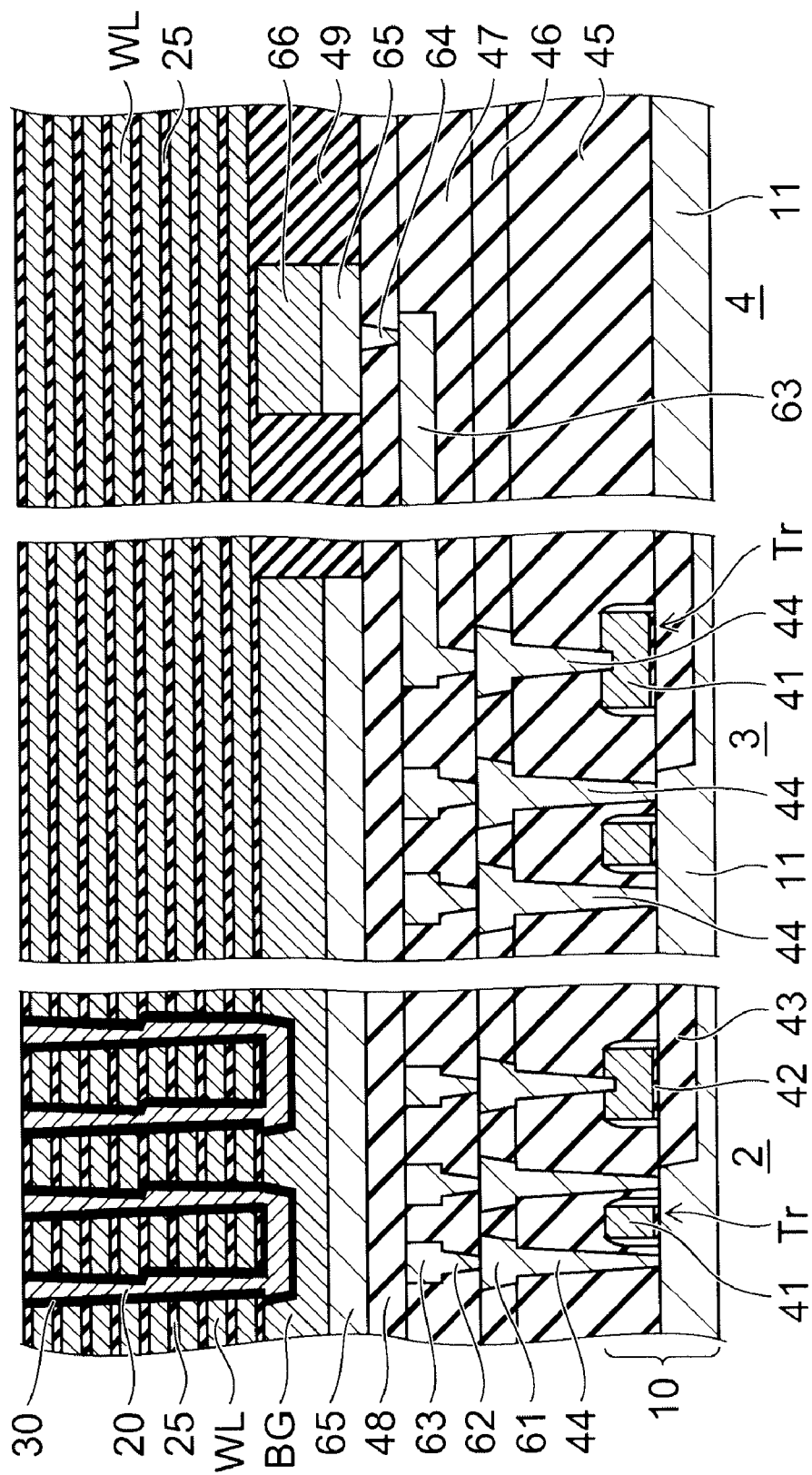

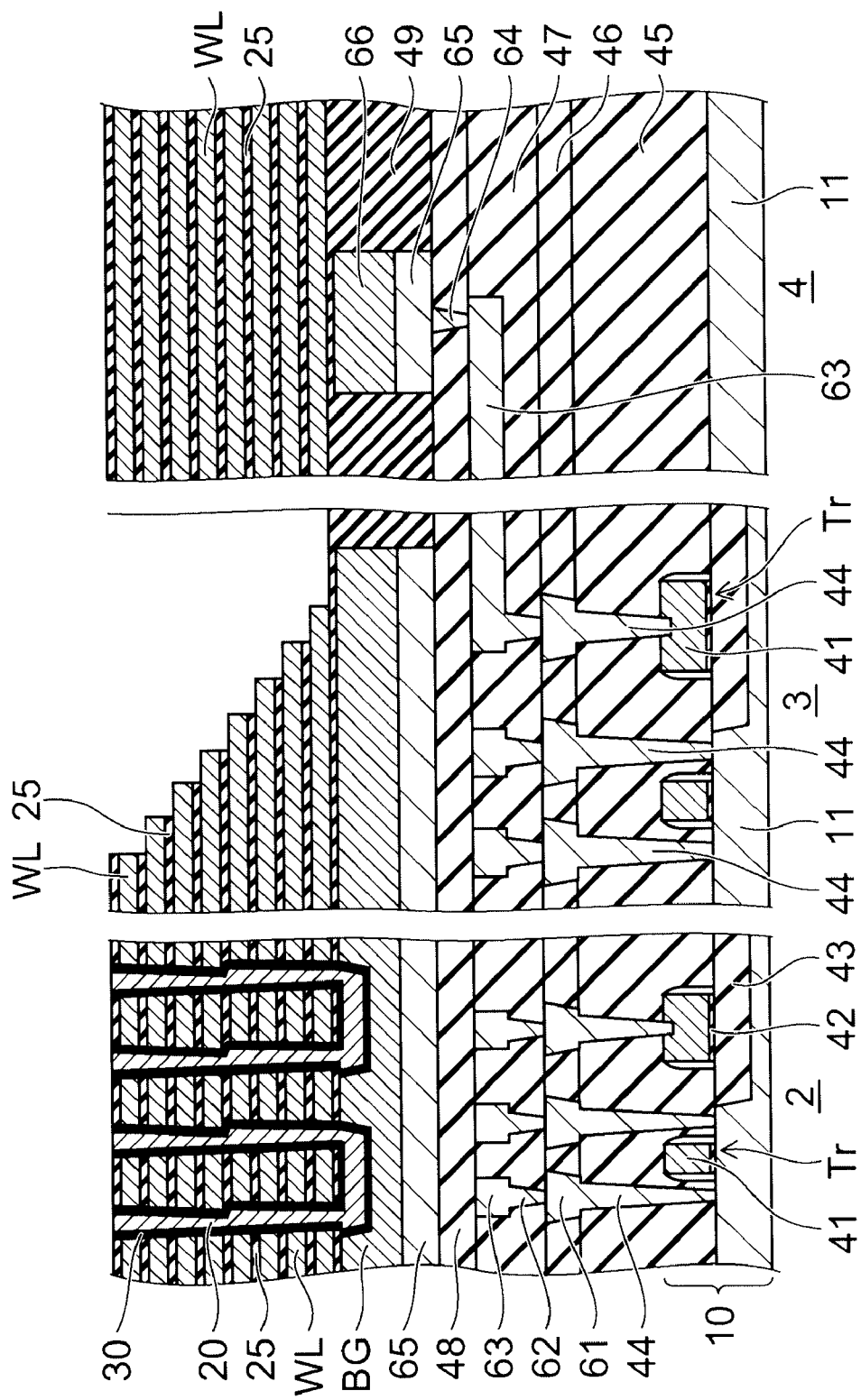

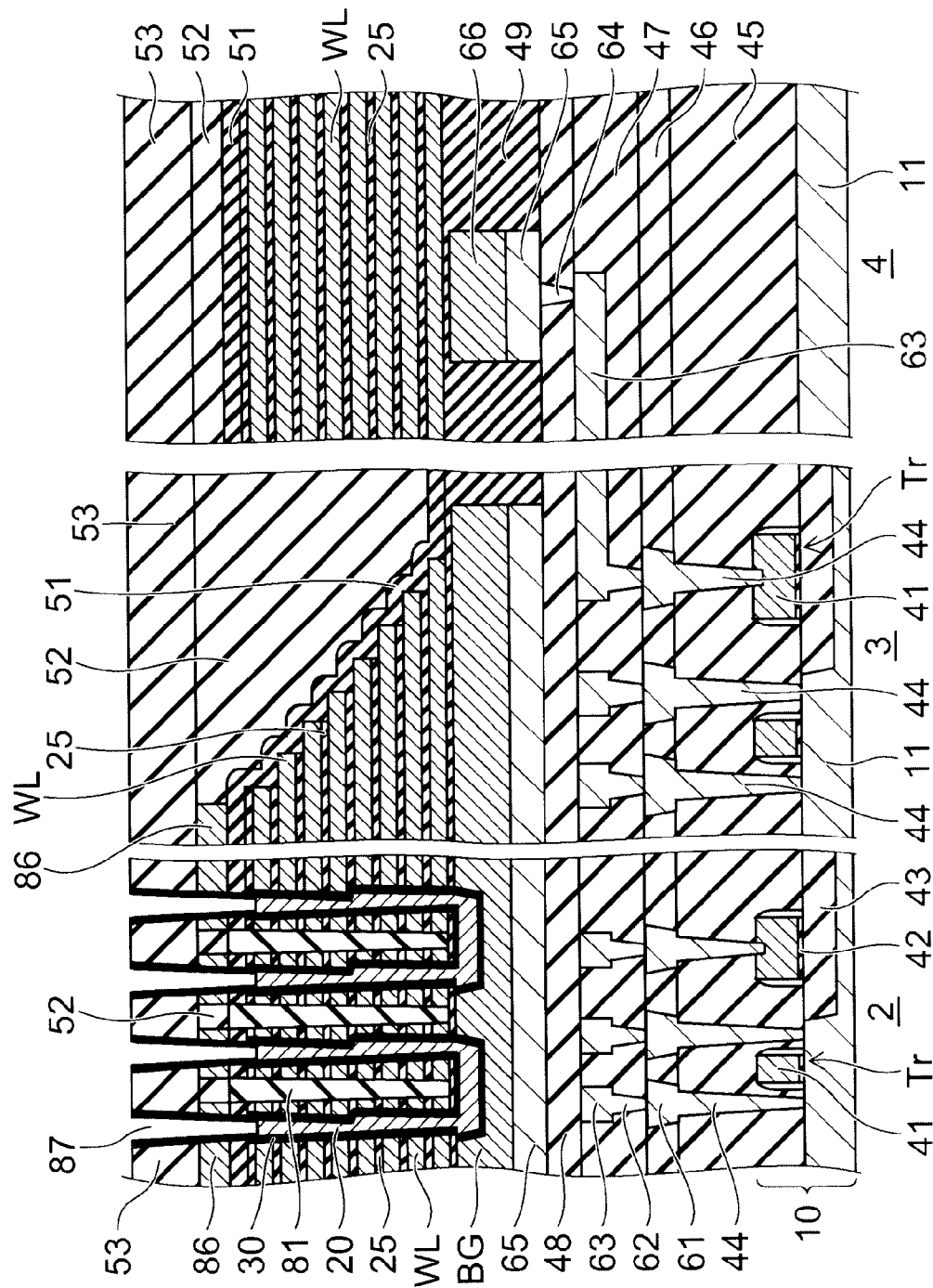

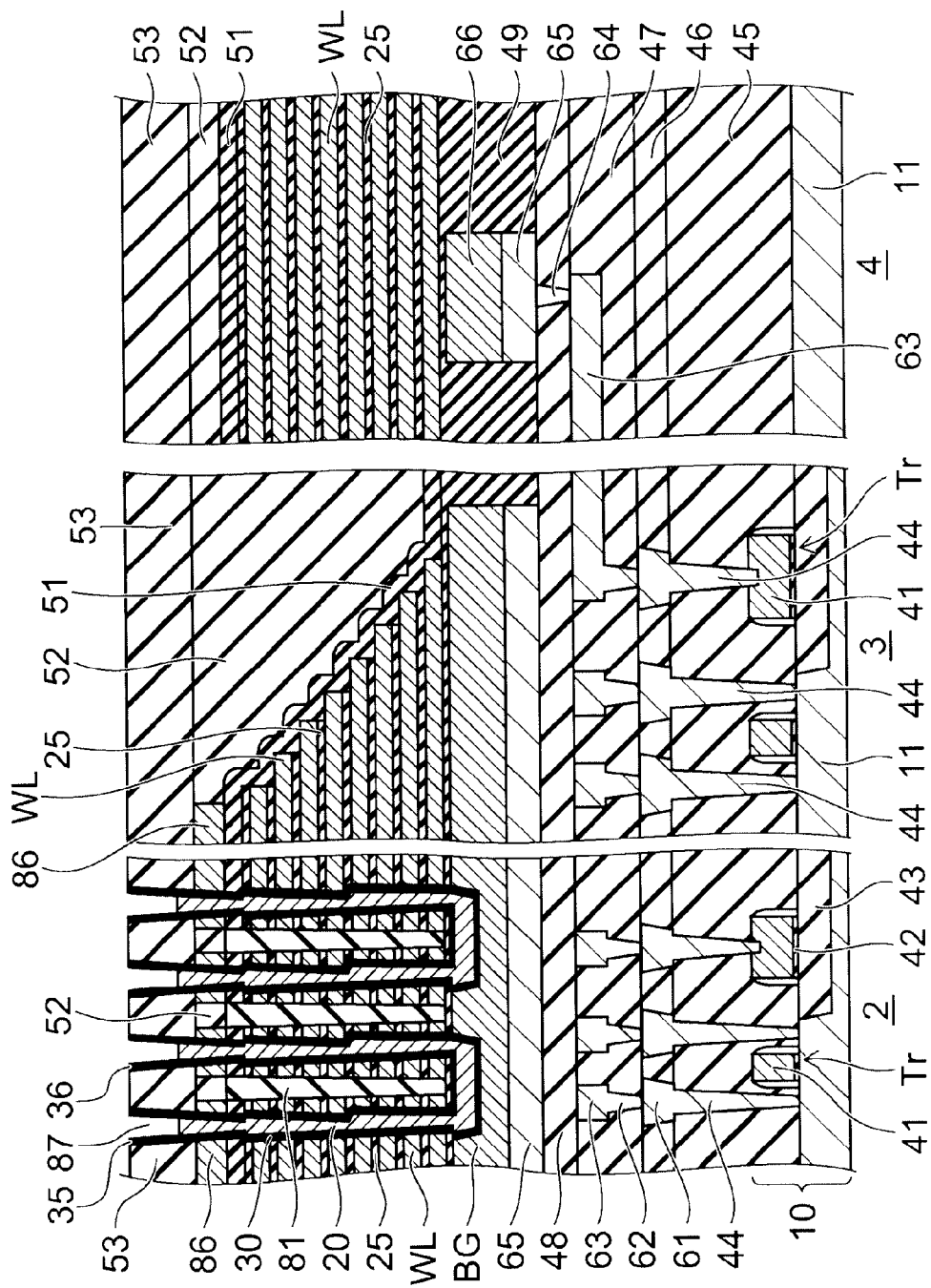

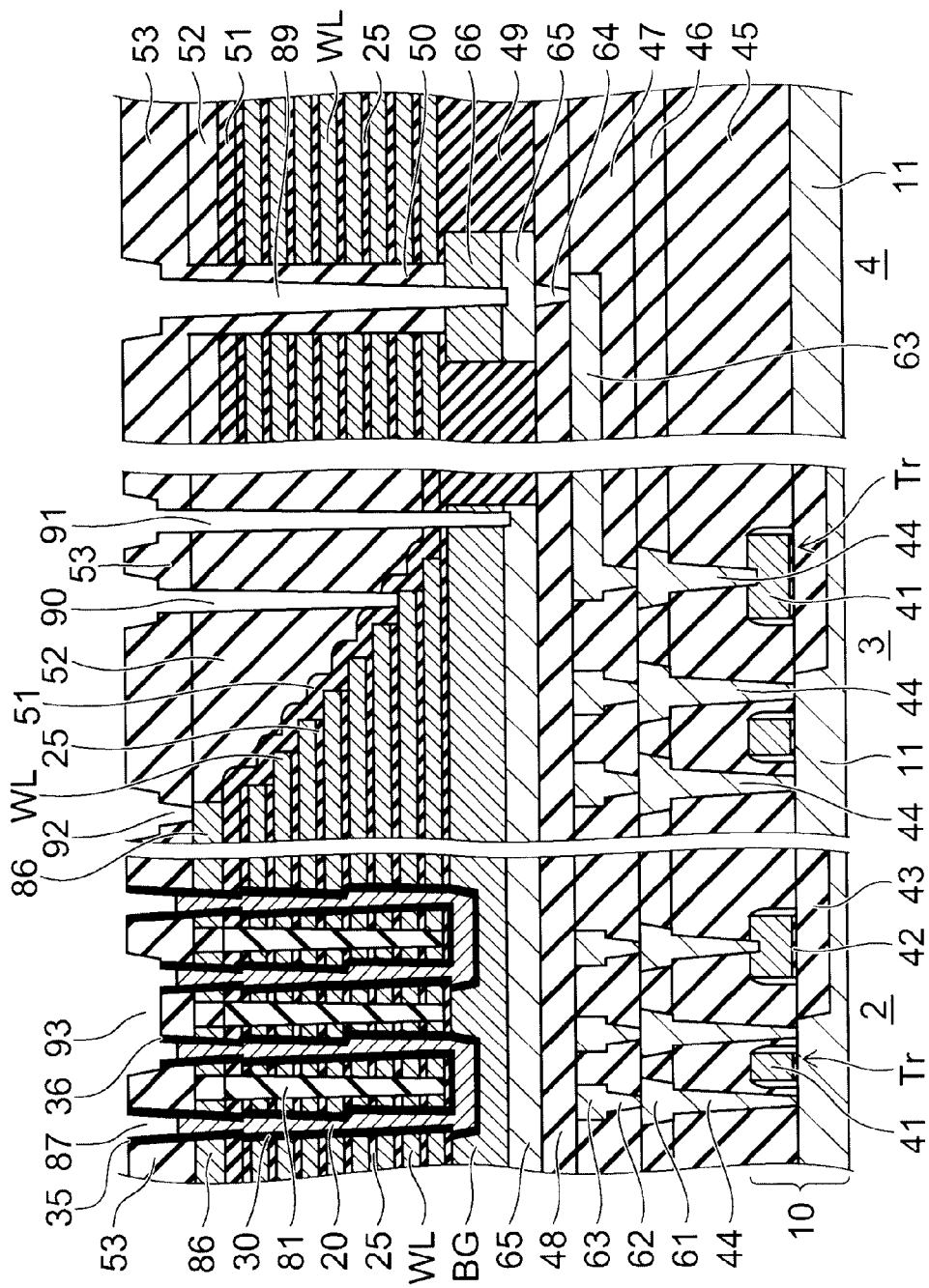

SEMICONDUCTOR MEMORY DEVICE AND METHOD FOR MANUFACTURING SAME

CROSS-REFERENCE TO RELATED APPLICATION

This application is based upon and claims the benefit of priority from Japanese Patent Application No. 2010-052887, filed on Mar. 10, 2010; the entire contents of which are incorporated herein by reference.

FIELD

Embodiments described herein relate generally to a semiconductor memory device and a method for manufacturing the same.

BACKGROUND

In conventional nonvolatile semiconductor memory devices (memory), elements have been integrated in a two-dimensional plane on a silicon substrate. The dimension of one element is decreased (the element is downsized) in order to increase the memory capacity of a memory, but the downsizing is becoming difficult these days in terms of cost and technique.

In contrast, a collectively processed three-dimensional stacked memory is proposed.

For example, JP-A 2009-146954 proposes a technology in which: memory holes are formed in a stacked body in which conductive layers functioning as control gates in a memory device and insulating layers are alternately stacked; a charge storage film is formed on an inner wall of the memory hole; and then silicon is provided in the memory hole to arrange memory cells three-dimensionally. If, in particular, the number of stacked layers in the stacked body increases in such a structure, it becomes difficult to form a contact structure for connecting the substrate and an interconnection above the stacked body.

BRIEF DESCRIPTION OF THE DRAWINGS

FIG. 5A to FIG. 19C are schematic cross-sectional views showing a method for manufacturing a semiconductor memory device according to the embodiment;

DETAILED DESCRIPTION

According to one embodiment, a semiconductor memory device includes a base, a stacked body, a memory film, a channel body, an interconnection, and a contact plug. The base includes a substrate and a peripheral circuit formed on a surface of the substrate. The stacked body includes a plurality of conductive layers and a plurality of insulating layers alternately stacked above the base. The memory film is provided on an inner wall of a memory hole punched through the stacked body to reach a lowermost layer of the conductive layers. The memory film includes a charge storage film. The channel body is provided on an inside of the memory film in the memory hole. The interconnection is provided below the stacked body. The interconnection electrically connects the lowermost layer of the conductive layers in an interconnection region laid out on an outside of a memory cell array region and the peripheral circuit. The memory cell array region has the memory film and the channel body. The contact plug pierces the stacked body in the interconnection region to reach the lowermost layer of the conductive layers in the interconnection region.

Embodiments will now be described with reference to the drawings. In the following embodiments, silicon is illustrated as the semiconductor, but semiconductors other than silicon may be used.

Figure 1:
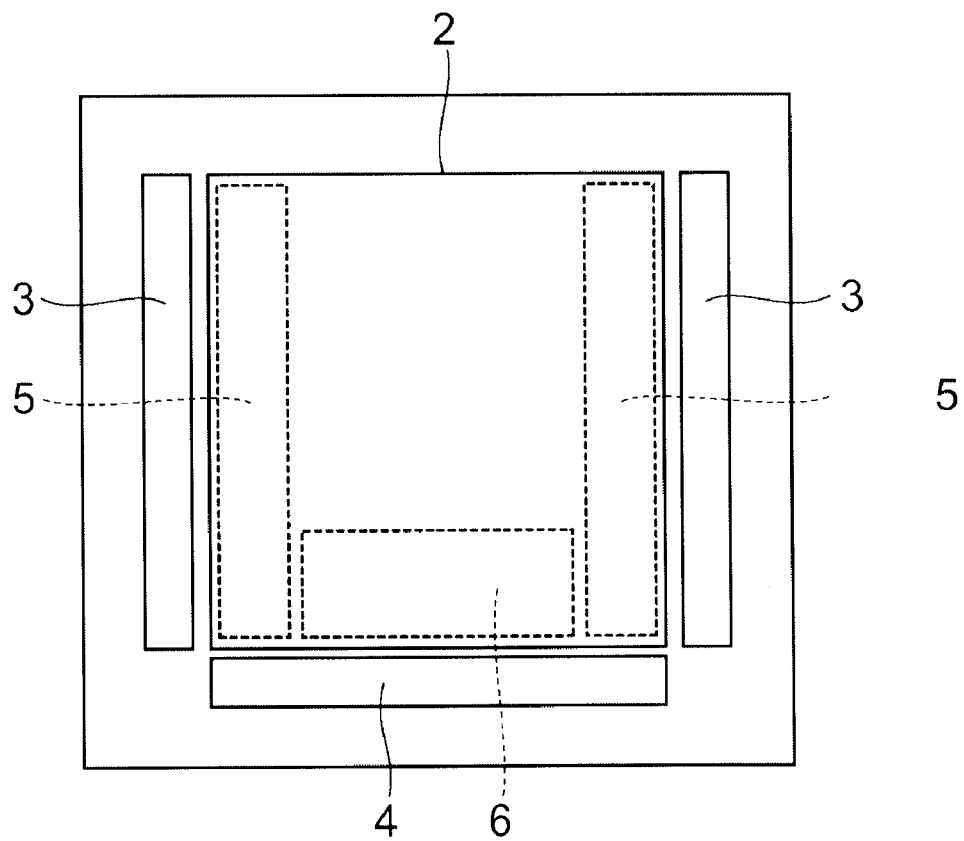
FIG. 1 is a schematic view illustrating a planar layout of a semiconductor memory device according to an embodiment.

FIG. 1 is a schematic view illustrating a planar layout of main components of a semiconductor memory device according to an embodiment. FIG. 1 illustrates one chip.

Figure 3:
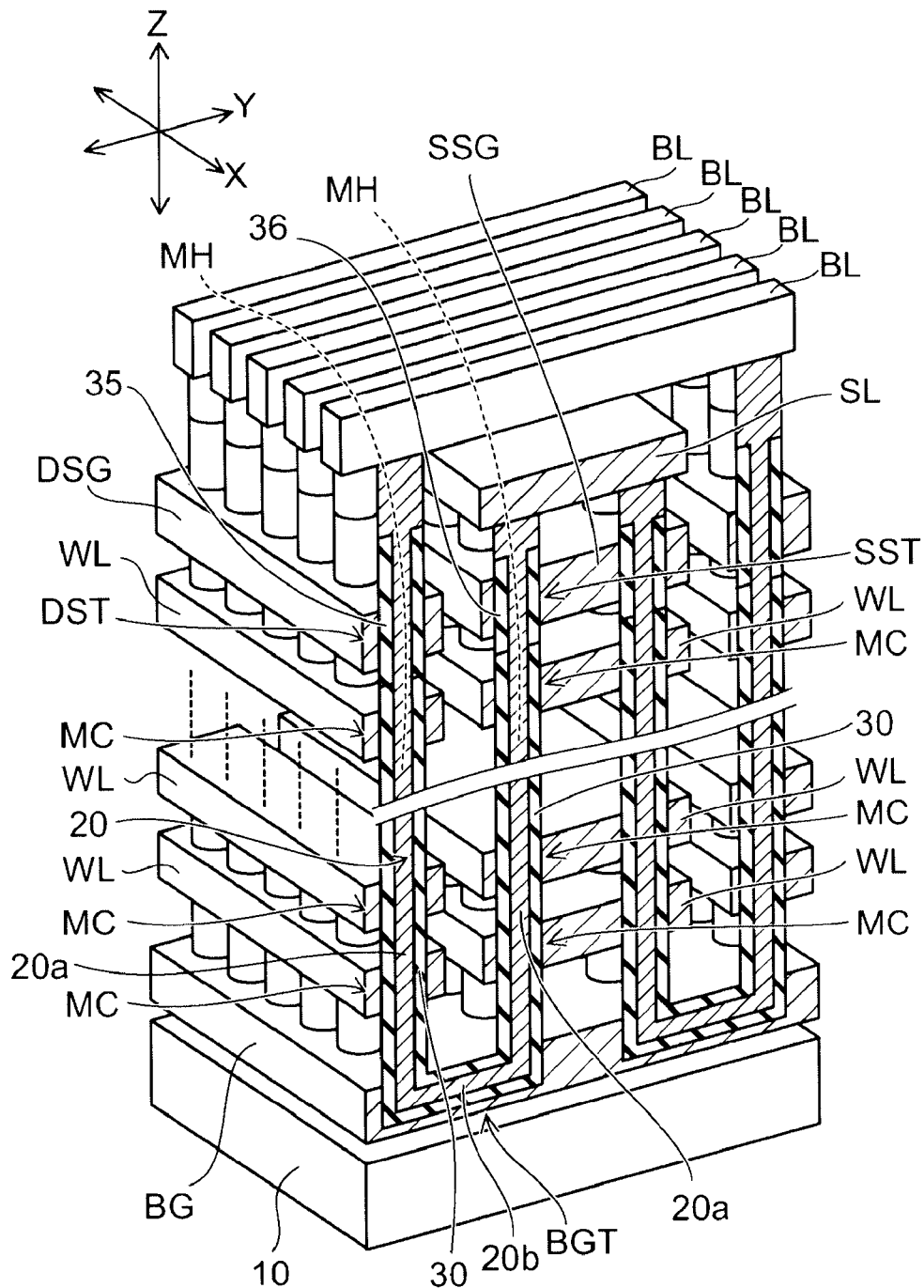
FIG. 3 is a schematic perspective view of the memory cell array of the semiconductor memory device.

A memory cell array region 2 is formed in the center of the chip. The memory cell array illustrated in FIG. 3 is formed in the memory cell array region 2. Peripheral circuits such as a row decoder 5 and a sense amplifier 6 are formed below the memory cell array region 2. It becomes possible to decrease the planar size of the chip by laying out the peripheral circuits below the memory cell array region 2. It is possible either to lay out all peripheral circuits below the memory cell array region 2 or to lay out only part of the peripheral circuits below the memory cell array region 2.

The memory cell array includes a plurality of conductive layers functioning as control gates as described later. Part of the stacked body including the conductive layers is processed into a staircase shape in a staircase-shaped contact region 3 which is laid out on the outside of the memory cell array region 2. The conductive layer of each stair processed into a staircase shape is connected to an upper interconnection (word line) in the staircase-shaped contact region 3. The staircase-shaped contact region 3 is formed near the row decoder 5, and the row decoder 5 is connected to the word lines. The row decoder 5 supplies an electric potential to each conductive layer of the memory cell array via the word line.

FIGS. 2A to 2C illustrate schematic cross-sectional views of the semiconductor memory device according to this embodiment. FIG. 2A is a cross-sectional view of the memory cell array region 2, FIG. 2B is a cross-sectional view of the staircase-shaped contact region 3, and FIG. 2C is a cross-sectional view of an interconnection region 4. The interconnection region 4 is laid out on the outside of the memory cell array region 2 as illustrated in FIG. 1, and is formed near the sense amplifier 6.

When the extending direction of a bit line is taken as a Y direction and a direction orthogonal thereto is taken as an X direction in FIG. 1, FIG. 2A and FIG. 2C correspond to a cross section along the Y direction and FIG. 2B corresponds to a cross section along the X direction.

FIG. 3 illustrates the memory cell array. In FIG. 3, for easier viewing of the drawing, illustration of insulating portions other than the insulating films formed in memory holes MH is omitted.

Further, in this specification, an XYZ orthogonal coordinate system is used for convenience of description. In this coordinate system, two directions parallel to the major surface of a base 10 and orthogonal to each other are defined as an X direction and a Y direction, and the direction orthogonal to both the X direction and the Y direction is defined as a Z direction. The X direction and the Y direction in FIG. 1 correspond to the X direction and the Y direction in FIG. 3, respectively.

Bit lines BL extend in the Y direction, and are connected to the sense amplifier 6 via contact plugs 67 provided in the interconnection region 4 as described later. A plurality of conductive layers WL are stacked in the Z direction. The conductive layer WL is divided into a plurality of parts in the Y direction.

Here, the base 10 includes a substrate 11 illustrated in FIGS. 2A to 2C and transistors Tr formed on the surface of the substrate 11. The transistor Tr includes a source region, a drain region, and a gate insulating film 42 formed on the surface of the substrate 11 and a gate electrode 41 provided on the gate insulating film 42. The transistor Tr is a component of a peripheral circuit such as the row decoder 5 or the sense amplifier 6. The peripheral circuit is formed on the surface of the substrate 11 in the memory cell array region 2 and the staircase-shaped contact region 3 as a semiconductor integrated circuit including the transistor Tr. The transistor Tr is dielectrically isolated from other transistors Tr by an element isolation region 43 of an STI (shallow trench isolation) structure, for example.

Insulating layers 45, 46, 47, and 48 are stacked sequentially on the substrate 11. Interconnections 63 are formed on the surface of the insulating layer 47. The source region, the drain region, and the gate electrode 41 of the transistor Tr are electrically connected to the interconnection 63 via a contact plug 44, an interconnection 61, and a contact plug 62 provided sequentially from the lower layer side. The insulating layer 48 is provided on the interconnection 63. The insulating layers 45 to 48 are provided over the entire surface of the substrate 11 including that in the memory cell array region 2, the staircase-shaped contact region 3, and the interconnection region 4.

A metal silicide layer 65 is provided on the insulating layer 48 as a layer containing a metal. The layer containing a metal may be a metal layer or an alloy layer. The metal silicide layers 65 in the memory cell array region 2 and the staircase-shaped contact region 3 are formed in one over a relatively wide area. The metal silicide layer 65 in the interconnection region 4 is patterned into a pad shape.

The memory cell array will now be described with reference to FIG. 2A and FIG. 3.

A back gate BG is provided on the metal silicide layer 65. The back gate BG is, for example, a silicon layer provided with an electrical conductivity by adding an impurity. A plurality of insulating layers 25 and the plurality of conductive layers WL are alternately stacked on the back gate BG. The conductive layer WL is, for example, a silicon layer provided with an electrical conductivity by adding an impurity. The insulating layer 25 is, for example, a TEOS (tetraethoxysilane) layer containing silicon oxide.

A stacked body including the plurality of conductive layers WL and the plurality of insulating layers 25 is divided into a plurality of blocks, and an insulator 81 is provided between the blocks.

In a block, a drain side selection gate DSG is provided above the uppermost conductive layer WL via the insulating layer 25 and a stopper film (e.g. a silicon nitride film) 51. The drain side selection gate DGS is, for example, a silicon layer provided with an electrical conductivity by adding an impurity. In another block adjacent to the block, a source side selection gate SSG is provided above the uppermost conductive layer WL via the insulating layer 25 and the stopper film 51. The source side selection gate SSG is, for example, a silicon layer provided with an electrical conductivity by adding an impurity.

A source line SL is provided above the source side selection gate SSG via an insulating layer 53. The source line SL is, for example, a silicon layer provided with an electrical conductivity by adding an impurity. Alternatively, a metal material may be used as the source line SL. The plurality of bit lines BL are provided above the source line SL and the insulating layer 53 via an insulating layer 54. Each bit line BL extends in the Y direction.

A plurality of U-shaped memory holes MH are formed in the stacked body described above. A hole punched through the drain side selection gate DSG and the underlying conductive layers WL and extending in the Z direction is formed in the block including the drain side selection gate DSG. A hole punched through the source side selection gate SSG and the underlying conductive layers WL and extending in the Z direction is formed in the block including the source side selection gate SSG. Both those holes are connected via a hole formed in the back gate BG and extending in the Y direction.

A U-shaped channel body (e.g. a silicon film) 20 is provided in the memory hole MH. A gate insulating film 35 is formed on the side wall of the memory hole MH between the drain side selection gate DSG and the channel body 20. A gate insulating film 36 is formed on the side wall of the memory hole MH between the source side selection gate SSG and the channel body 20.

A memory film 30 is formed on the side wall of the memory hole MH between each conductive layer WL and the channel body 20. The memory film 30 is formed also on the side wall of the memory hole MH between the back gate BG and the channel body 20. The memory film 30 has, for example, an ONO (oxide-nitride-oxide) structure in which a silicon nitride film is placed between a pair of silicon oxide films.

Figure 4:
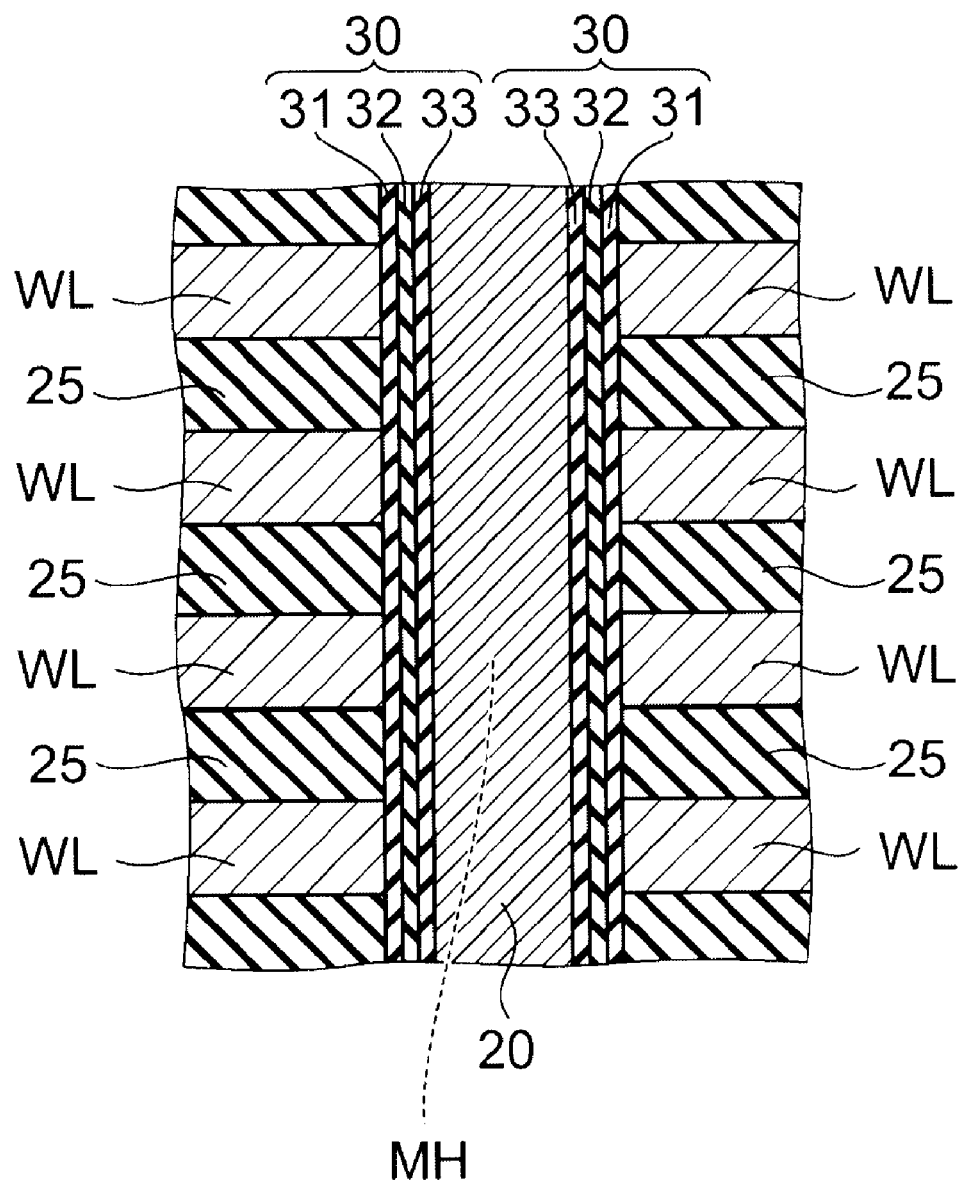
FIG. 4 is an enlarged cross-sectional view of the relevant part in FIG. 3.

FIG. 4 illustrates an enlarged cross section of a portion where the channel body 20 pierces the plurality of conductive layers WL and the insulating layers 25 between layers.

A first insulating film 31, a charge storage film 32, and a second insulating film 33 are provided between each conductive layer WL and the channel body 20 sequentially from the conductive layer WL side. The first insulating film 31 is in contact with the conductive layer WL, the second insulating film 33 is in contact with the channel body 20, and the charge storage film 32 is provided between the first insulating film 31 and the second insulating film 33.

The channel body 20 functions as a channel, the conductive layer WL functions as a control gate, and the charge storage film 32 functions as a data memory layer that stores charges injected from the channel body 20. That is, a memory cell having a configuration in which the control gate surrounds the channel is formed at the intersection of the channel body 20 and each conductive layer WL.

The semiconductor memory device according to this embodiment can perform electrically any erasing/writing of data, and is a nonvolatile semiconductor memory device that can retain the stored contents even when the power is turned off. For example, the memory cell is a memory cell of the charge trap structure. The charge storage film 32 includes a large number of traps that confine a charge (electron), and is a silicon nitride film, for example. The second insulating film 33 is a silicon oxide film, for example, and becomes a potential barrier when charges are injected from the channel body 20 to the charge storage film 32 or when charges stored in the charge storage film 32 diffuse into the channel body 20. The first insulating film 31 is a silicon oxide film, for example, and prevents charges stored in the charge storage film 32 from diffusing into the conductive layer WL.

As illustrated in FIG. 3, the drain side selection gate DSG, the channel body 20 piercing the drain side selection gate DSG, and the gate insulating film 35 provided between this channel body 20 and the drain side selection gate DSG form a drain side selection transistor DST. The upper end of the channel body 20 protruding upward from the drain side selection gate DSG is connected to each corresponding bit line BL via plugs 72 and 73 illustrated in FIG. 2A.

The source side selection gate SSG, the channel body 20 piercing the source side selection gate SSG, and the gate insulating film 36 provided between this channel body 20 and the source side selection gate SSG form a source side selection transistor SST. The upper end of the channel body 20 protruding upward from the source side selection gate SSG is connected to the source line SL.

The back gate BG, the channel body 20 provided in the back gate BG, and the memory film 30 between the back gate BG and the channel body 20 form a back gate transistor BGT.

As illustrated in FIG. 3, between the drain side selection transistor DST and the back gate transistor BGT, a memory cell MC using each conductive layer WL as a control gate is provided in plural in accordance with the number of conductive layers WL.

Similarly, also between the back gate transistor BGT and the source side selection transistor SST, a memory cell MC using each conductive layer WL as a control gate is provided in plural in accordance with the number of conductive layers WL.

The memory cells MC, the drain side selection transistor DST, the back gate transistor BGT, and the source side selection transistor SST are connected in series to form a U-shaped memory string. That is, the channel body 20 is formed in a U-shaped configuration that includes: a pair of columns 20a extending in the stack direction of the stacked body; and a connection 20b embedded in the back gate BG and connecting the pair of columns 20a. A plurality of U-shaped memory strings are arranged in the X direction and Y direction. Thereby, a plurality of memory cells MC are provided three-dimensionally in the X direction, Y direction, and Z direction.

Next, the configuration of the staircase-shaped contact region 3 will now be described with reference to FIG. 2B.

Part of the stacked body of the plurality of conductive layers WL and the plurality of insulating layers 25 is processed into a staircase shape in the staircase-shaped contact region 3. The staircase-shaped structure is covered with the stopper film 51, and interlayer insulating films 52 and 53 are provided on the stopper film 51. For example, the stopper film 51 is a silicon nitride film, and the interlayer insulating films 52 and 53 are silicon oxide films.

In the interlayer insulating films 52 and 53 and the stopper film 51, a plurality of contact holes are formed. The contact holes are punched through the interlayer insulating films 52 and 53 and the stopper film 51 to reach the respective conductive layers WL of the corresponding stairs. A contact plug 68 for the word line is provided in each contact hole. For easier viewing of the drawing, FIG. 2B illustrates only the contact plug 68 connected to, for example, the second lowermost conductive layer WL. However, the conductive layer WL of each stair is connected to each contact plug 68.

Word lines 77 are provided above the insulating layer 53 via the insulating layer 54. The contact plug 68 is connected to the word line 77 via a contact plug 76 provided on the contact plug 68.

The conductive layer WL of each stair in the staircase-shaped contact region 3 is formed in one with each corresponding conductive layer WL in the memory cell array region 2. Therefore, each conductive layer WL of the memory cell array is electrically connected to each corresponding word line 77 via the contact plugs 68 and 76.

The metal silicide layer 65 and the back gate BG in the staircase-shaped contact region 3 are formed in one with the metal silicide layer 65 and the back gate BG in the memory cell array region 2. The metal silicide layer 65 and the back gate BG in the staircase-shaped contact region 3 are electrically connected to a not-illustrated upper interconnection via a contact plug 69. The contact plug 69 is provided in a contact hole punched through the insulating layers 53 and 52, the stopper film 51, the insulating layer 25, and the back gate BG to reach the metal silicide layer 65.

The drain side selection gate DSG is pulled out to the upper side of the uppermost conductive layer WL in the staircase-shaped contact region 3, and that portion is electrically connected to an upper interconnection 75 via contact plugs 71 and 74. Similarly, the source side selection gate SSG is pulled out to the upper side of the uppermost conductive layer WL in the staircase-shaped contact region 3, and that portion is electrically connected to the upper interconnection 75 via the contact plugs 71 and 74.

Next, the configuration of the interconnection region 4 will now be described with reference to FIG. 2C.

The stacked body of the plurality of conductive layers WL and the plurality of insulating layers 25 described above is provided also in the interconnection region 4. A pad 66 is provided below the stacked body. The pad 66 is made by patterning the back gate BG formed in the interconnection region 4. Therefore, the pad 66 is made of the same material as the back gate BG provided in the memory cell array region 2 and the staircase-shaped contact region 3, and has the same thickness as them. Also the metal silicide layer 65 stacked below the back gate BG is patterned into a pad shape in the interconnection region 4.

In the interconnection region 4, an insulating layer 49 is provided in the portion where the back gate BG and the metal silicide layer 65 are removed. Therefore, the pad 66 and the underlying metal silicide layer 65 in the interconnection region 4 are divided from the back gate BG and the metal silicide layer 65 in the memory cell array region 2 and the staircase-shaped contact region 3 via the insulating layer 49.

The interconnection 63 connected to the transistor Tr described above extends to the interconnection region 4. The insulating layer 48 is provided on the interconnection 63, and the metal silicide layer 65 and the pad 66 are provided on the insulating layer 48. The interconnection 63 is connected to the metal silicide layer 65 via a contact plug 64 provided to pierce the insulating layer 48.

A contact plug 67 piercing the stacked body is provided on the metal silicide layer 65 in the interconnection region 4. The stopper film 51 and the interlayer insulating films 52 and 53 described above are provided also on the stacked body in the interconnection region 4. The contact plug 67 pierces the interlayer insulating films 53 and 52, the stopper film 51, the stacked body, and the pad 66 to reach the metal silicide layer 65. Alternatively, the lower end of the contact plug 67 may not reach the metal silicide layer 65 but remain in the pad 66. The planar sizes of the pad 66 and the underlying metal silicide layer 65 are larger than the line widths of the interconnection 63 and the bit line BL which are connection destinations.

The bit line BL extends also to the interconnection region 4. That is, the bit line BL is provided above the contact plug 67 and the interlayer insulating film 53 in the interconnection region 4 via the interlayer insulating film 54. The upper end of the contact plug 67 is connected to the bit line BL via a contact plug 78 piercing the interlayer insulating film 54. The contact structure illustrated in FIG. 2C is provided in plural in accordance with the number of bit lines BL.

Therefore, each bit line BL is electrically connected to the transistor Tr constituting the sense amplifier 6 via the contact plugs 78 and 67, the pad 66, the metal silicide layer 65, the contact plug 64, and the interconnection 63.

An insulator 50 such as silicon oxide is provided between the contact plug 67 and the stacked body in the interconnection region 4, and the contact plug 67 and the conductive layers WL of the stacked body are insulated.

The conductive layers WL in the stacked body in the interconnection region 4 are provided as dummy layers not electrically connected to conductive portions such as the conductive layers WL and other interconnections in the memory cell array region 2 and the staircase-shaped contact region 3. A large difference in level is not formed above the substrate 11 by providing the stacked body over the entire surface of the substrate 11 including that in the interconnection region 4. This facilitates the process and also can suppress a structural defect.

The memory cell of the structure mentioned above does not have a configuration in which a channel is formed on the surface of the substrate. Therefore, the peripheral circuit can be formed on the surface of the substrate 11, and the memory cell array can be provided thereon. That is, it is not necessary to lay out the memory cell array and the peripheral circuit separately in a planar configuration, and this serves to downsize the chip.

In the case of that configuration, it is necessary to electrically connect the peripheral circuit on the surface of the substrate 11 and the interconnection provided above the stacked body (for example, the bit line BL is illustrated in this embodiment). Progress in the miniaturization of circuit pattern in semiconductor device is accompanied by the miniaturization of the line widths of the interconnection 63 and the bit line BL. A positional misalignment readily occurs when the interconnections with minute line widths are connected across the stacked body by the contact plug. Furthermore, the aspect ratio (ratio of depth to diameter) of the contact hole increases as the number of stacked layers of the stacked body increases with increasing memory capacity. This raises the degree of difficulty in the process for connecting the interconnections with minute line widths located above and below the stacked body.

This embodiment connects the contact plug 67 and the interconnection 63 by using the pad 66 having a larger planar size than the line widths of the interconnection 63 and the bit line BL as described above. The alignment of the contact plug 67 to the pad 66 is easy as compared with the alignment of the contact plug 67 to the interconnection 63 with a minute line width.

Furthermore, the diameter or thickness of the contact plug 67 also can be increased in accordance with the planar size of the pad 66, and therefore the connection of the bit line BL to the upper end of the contact plug 67 also becomes easy. Furthermore, the increased diameter of the contact plug 67 decreases the aspect ratio of the contact hole, and this improves the embeddability of a conductive material into the contact hole.

Moreover, the pad 66 is formed by using part of the back gate BG, which is originally necessary for the memory cell array, and is obtained easily by performing patterning on the back gate BG in the interconnection region 4 after forming the back gate BG over the entire surface of the base substance 10. The number of processes is small and the cost can be reduced as compared with the case where an interconnection layer for a pad is separately formed. Furthermore, the pad 66 in the interconnection region 4 exists on the same stair as the back gate BG in the memory cell array region 2, and this causes no increase in the thickness of the device. The size and layout of the pad 66 can be designed relatively freely by an alteration of the mask pattern.

Silicon is used as the back gate BG in terms of the threshold controllability in the back gate transistor BGT. Therefore, also the pad 66 is silicon. However, the metal silicide layer 65 having a lower resistance than silicon is provided below the pad 66 in this embodiment. Furthermore, the contact plug 67 pierces the pad 66 to reach the metal silicide layer 65. Thereby, the resistance between the contact plug 67 and the interconnection 63 can be reduced.

Since the metal silicide layer 65 is provided not only below the pad 66 in the interconnection region 4 but also below the back gate BG in the memory cell array, the resistance of the back gate BG also can be reduced.

Next, a method for manufacturing the semiconductor memory device according to this embodiment will now be described with reference to FIG. 5A to FIG. 19C. The drawings of the number with "A", "B", and "C" correspond to cross-sections in FIG. 2A, FIG. 2B, and FIG. 2C described above, respectively.

First, as illustrated in FIGS. 5A to 5C, the transistors Tr that constitute the peripheral circuits are formed on the surface of the substrate (e.g. a silicon substrate) 11. Specifically, the element isolation region 43, the source region, the drain region, the gate insulating film 42, the gate electrode 41, and the like are formed by using the lithography method, the RIE (reactive ion etching) method, the ion implantation method, and the like.

Next, the interlayer insulating films 45 and 46 are deposited on the substrate 11, contact holes are formed in the interlayer insulating film 45, and interconnection trenches are formed in the interlayer insulating film 46. Then, a conductive material is deposited in the contact hole and the interconnection trench, and the conductive material on the interlayer insulating film 46 is removed by, for example, the CMP (chemical mechanical polishing) method. Thereby, the contact plugs 44 and the interconnections 61 are simultaneously formed. The contact plug 44 and the interconnection 61 include, for example, a titanium film, a titanium nitride film, and a tungsten film formed sequentially from the inner wall side of the contact hole or the interconnection trench.

Next, the interlayer insulating film 47 is deposited on the interlayer insulating film 46, and the contact plugs 62 and the interconnections 63 are formed in a manner similar to the above. The contact plug 62 is connected to the interconnection 61, and the interconnection 63 is connected to the contact plug 62. The interconnections are not limited to the two-layer structure but may be one layer, or the number of layers may be further increased as necessary.

Next, as illustrated in FIGS. 6A to 6C, the interlayer insulating film 48 is deposited on the interconnection 63 and the interlayer insulating film 47. Then, contact holes are formed in the interlayer insulating film 48 in the interconnection region 4, and the contact plug 64 is formed in the contact hole. The contact plug 64 includes, for example, a titanium film, a titanium nitride film, and a tungsten film formed sequentially from the inner wall side of the contact hole.

Next, the metal silicide layer 65 and the back gate BG are deposited sequentially on the interlayer insulating film 48. For example, the metal silicide layer 65 is a tungsten silicide layer, and the back gate BG is a silicon layer. The stacked body of the metal silicide layer 65 and the back gate BG is formed over the entire surface of the substrate 11 including that in the memory cell array region 2, the staircase-shaped contact region 3, and the interconnection region 4.

Next, as illustrated in FIG. 7A, concaves 82 are formed in the back gate BG in the memory cell array region 2, and then a sacrifice film 83 is buried in the concave 82. The sacrifice film 83 on the back gate BG is removed by, for example, the CMP method or the RIE method. The sacrifice film 83 is a silicon nitride film, for example.

Further, as illustrated in FIG. 7C, the back gate BG and the metal silicide layer 65 in the interconnection region 4 are patterned by the lithography method and the RIE method. Thereby, the pad 66, which is part of the back gate BG, and the metal silicide film 65 in a pad shape stacked therebelow are formed in the interconnection region 4. The pad 66 and the underlying metal silicide layer 65 are electrically connected to the interconnection 63 via the contact plug 64.

The interlayer insulating film 49 is formed in the portion where the back gate BG and the metal silicide layer 65 are selectively removed. Accordingly, the pad 66 and the metal silicide layer 65 in the interconnection region 4 are electrically insulated from the back gate BG and the metal silicide layer 65 in the memory cell array region 2 and the staircase-shaped contact region 3.

Figures 8A, 8B, 8C:
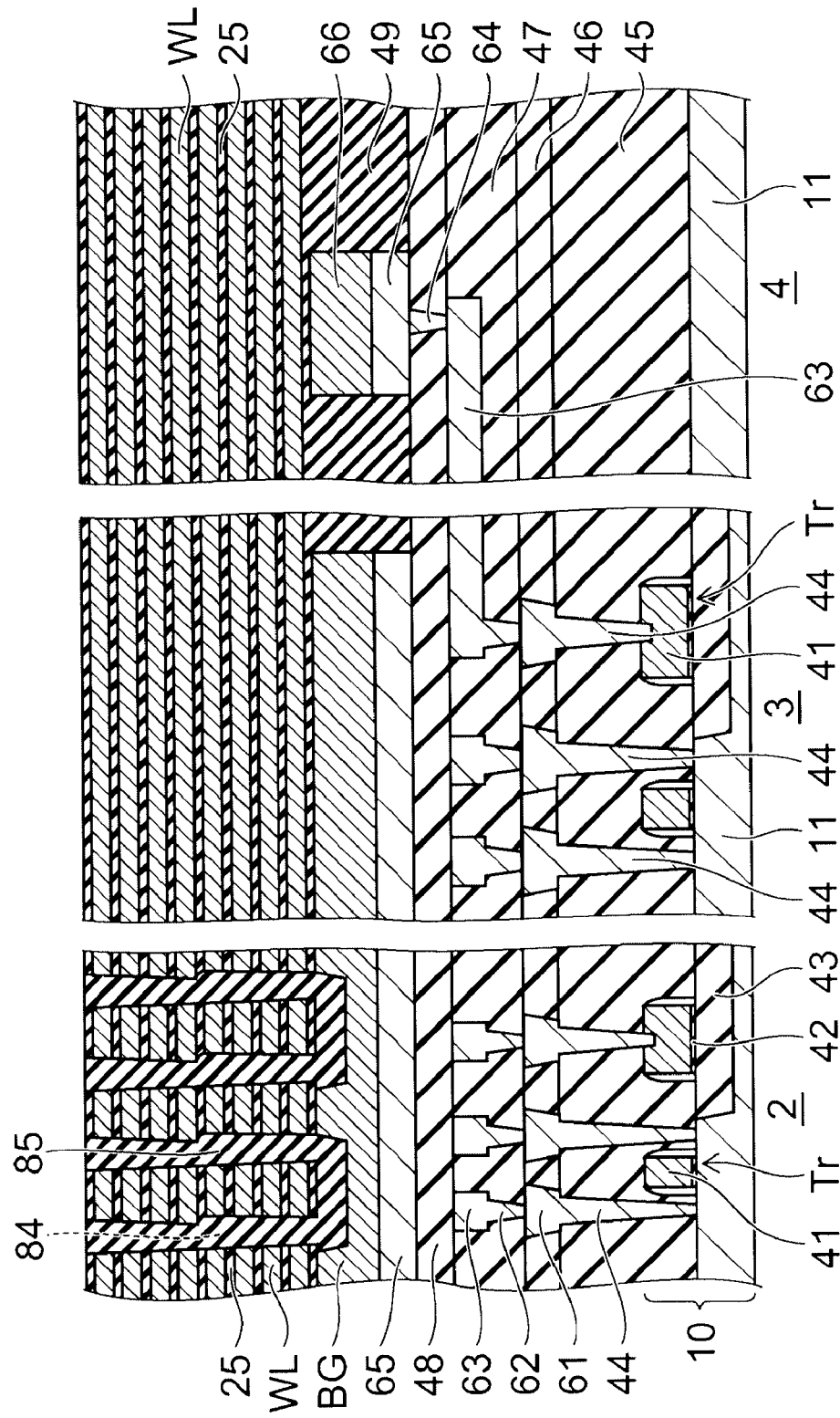

Next, as illustrated in FIGS. 8A to 8C, the plurality of insulating layers 25 and the plurality of conductive layers WL are alternately stacked on the back gate BG. The stacked body of the insulating layers 25 and the conductive layers WL is formed over the entire surface of the substrate 11 including that in the memory cell array region 2, the staircase-shaped contact region 3, and the interconnection region 4.

After the stacked body including, for example, four conductive layers WL is stacked, holes 84 punched through the stacked body to reach the sacrifice film 83 are formed. Then, a silicon nitride film, for example, is buried in the hole 84 as a sacrifice film 85. This series of processes are repeated one more time and thus a configuration can be obtained in which holes 84 reaching the sacrifice film 83 of the back gate BG are formed in the stacked body including, for example, eight conductive layers WL. In the case where the number of layers is further increased, the series of processes mentioned above may be further repeated.

Figures 9A, 9B, 9C:
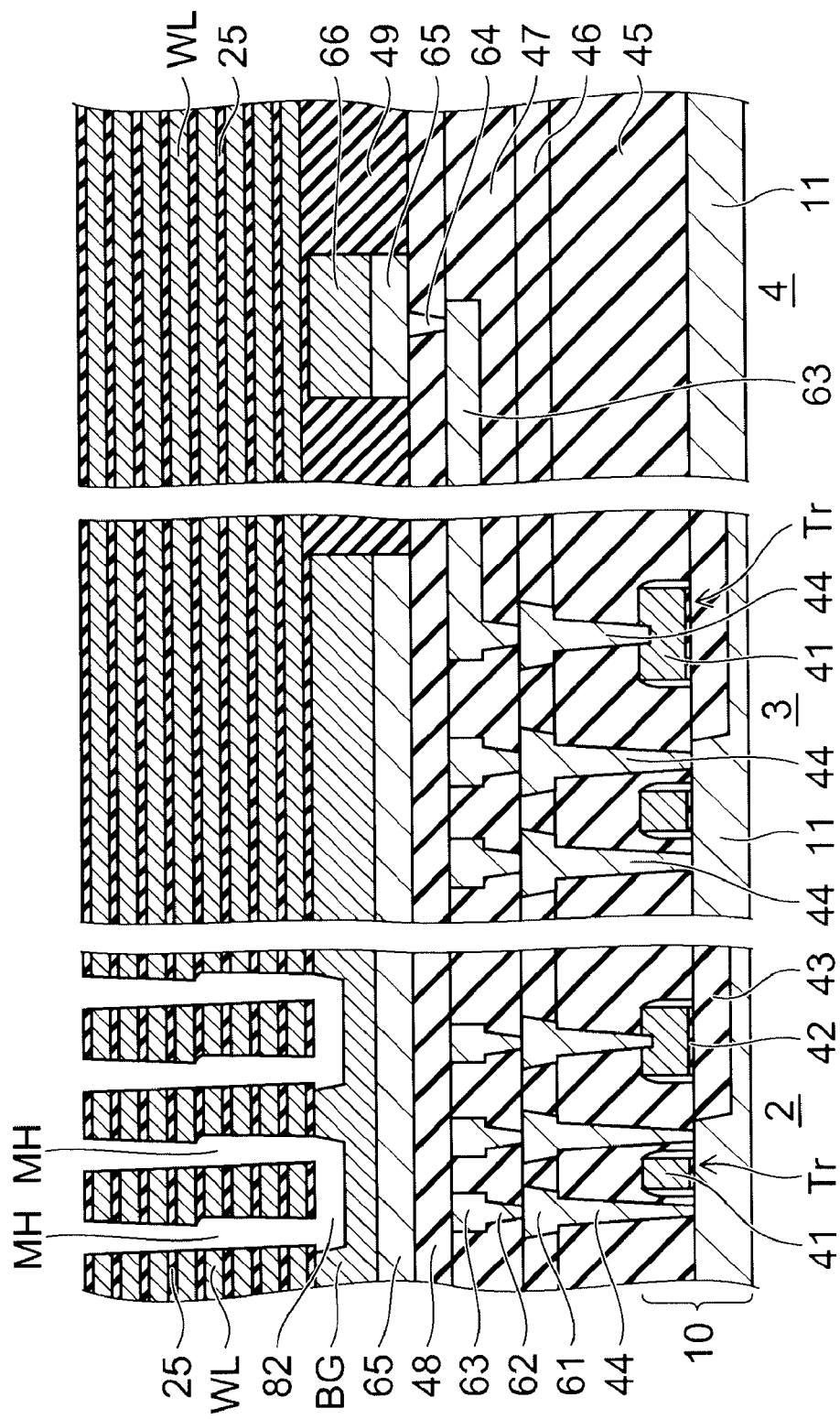

Next, the sacrifice film 85 and the sacrifice film 83 are removed by using, for example, a hot phosphoric acid solution. Thereby, the U-shaped memory holes MH are formed in the stacked body in the memory cell array region 2 as illustrated in FIG. 9A.

Next, the inner wall face of the memory hole MH is cleaned by, for example, dilute hydrofluoric acid treatment, and then the memory film 30 is formed on the inner wall of the memory hole MH as illustrated in FIG. 10A. Further, a silicon film that forms the channel body 20 is formed on the inside of the memory film 30 in the memory hole MH. At this time, the silicon film is formed preferably so that the memory hole MH may not be completely filled up with the silicon film but a cavity may remain in the memory hole MH. Thereby, the film thickness of the channel body 20 is not dependent on a variation in the hole diameter of the memory hole MH, but is determined by the film thickness of the deposited silicon film. After that, the surface of the silicon film is oxidized, and then a silicon oxide film is buried in the remaining cavity portion in the memory hole MH by, for example, the CVD (chemical vapor deposition) method.

Next, as illustrated in FIG. 11B, the stacked body in the staircase-shaped contact region 3 is processed into a staircase shape. Specifically, the staircase structure illustrated in FIG. 11B is formed by repeating a process that slims the planar size of a resist film formed on the upper face of the stacked body and a process that performs RIE on portions of the conductive layer WL not covered with the resist film and the underlying insulating layer 25 each one at a time.

Figures 12A, 12B, 12C:
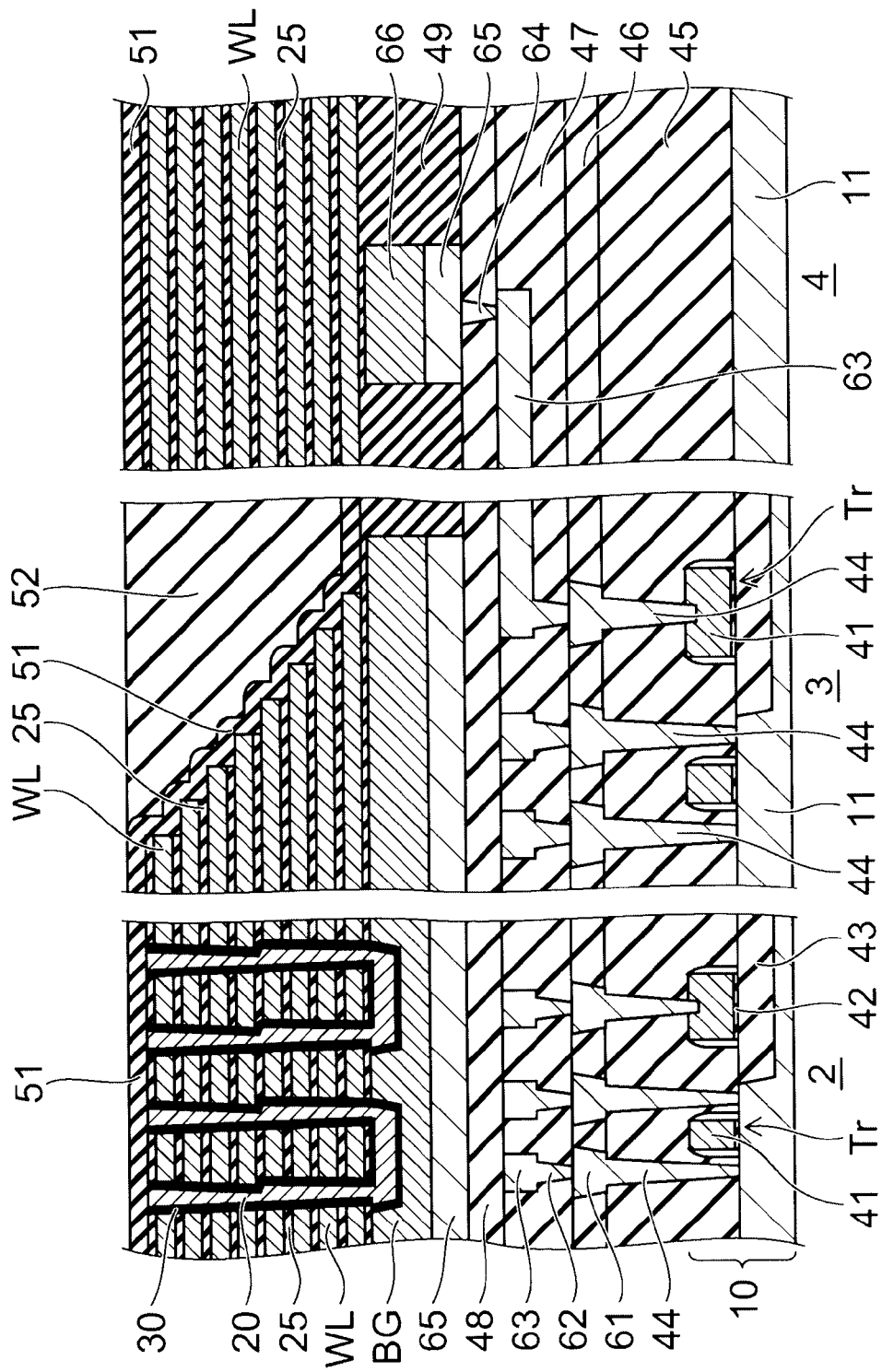

Next, as illustrated in FIG. 12B, the staircase structure is covered with the stopper film 51, the interlayer insulating film 52 is deposited thereon, and the upper portion of the interlayer insulating film 52 is planarized by, for example, the CMP method. For example, the stopper film 51 is a silicon nitride film, and the interlayer insulating film 52 is a silicon oxide film. The stopper film 51 is formed and left also on the stacked body in the memory cell array region 2 and on the stacked body in the interconnection region 4.

Figures 13A, 13B, 13C:
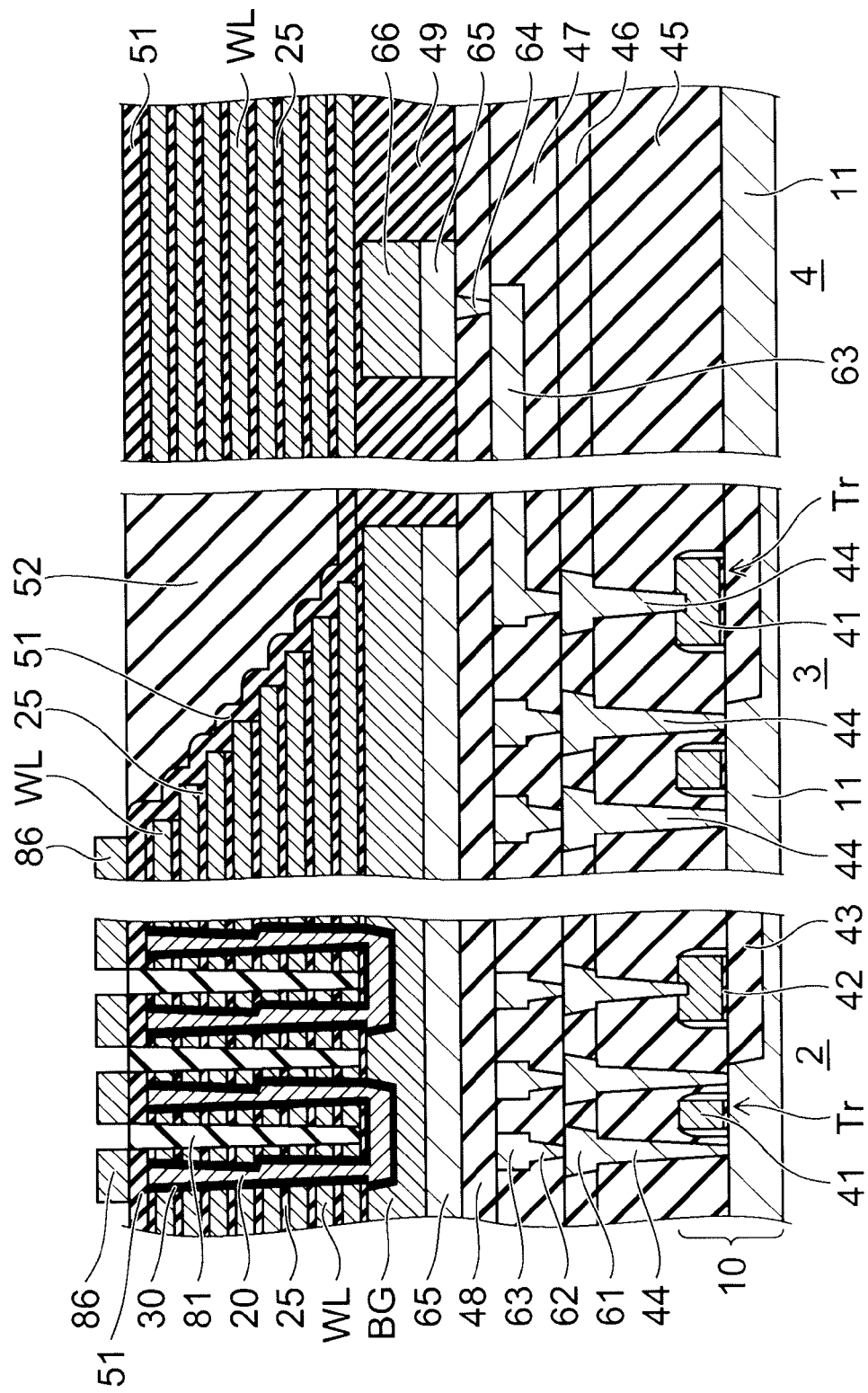

Next, as illustrated in FIG. 13A, slits are formed in the stacked body in the memory cell array region 2 to divide the stacked body into a plurality of blocks. Then, a metal (e.g. cobalt) film is formed on the side wall of the slit by, for example, the CVD method, and heat treatment is performed. Thereby, metal silicide is formed in a portion of the conductive layer WL facing the slit. After that, the unreacted portion of the metal film is removed by using, for example, a mixed solution of sulfuric acid and hydrogen peroxide, and the insulator (e.g. a silicon nitride film) 81 is buried in the slit.

Then, a conductive layer (e.g. a silicon layer) 86 is deposited on the stacked body in the memory cell array region 2, the staircase-shaped contact region 3, and the interconnection region 4, and the conductive layer 86 in the memory cell array region 2 is patterned into line shapes. The conductive layer 86 processed into a line shape forms the drain side selection gate DSG or the source side selection gate SSG.

The conductive layer 86 in the staircase-shaped contact region 3 also is patterned to be selectively left above the uppermost conductive layer WL. The conductive layer 86 in the staircase-shaped contact region 3 is connected to the conductive layer 86 (the drain side selection gate DSG or the source side selection gate SSG) in the memory cell array region 2.

As illustrated in FIGS. 14A and 14B, the interlayer insulating film 52 is buried in the portion where the conductive layer 86 is selectively removed.

Then, the interlayer insulating film 53 is deposited on the conductive layer 86 and the interlayer insulating film 52, and the upper portion of the interlayer insulating film 53 is planarized by, for example, the CMP method. Next, as illustrated in FIG. 14A, holes 87 reaching the upper portions of the U-shaped memory strings are formed by the lithography method and the RIE method.

Next, as illustrated in FIG. 15A, a silicon nitride film, for example, that forms the gate insulating films 35 and 36 of the drain side selection transistor DST and the source side selection transistor SST, respectively, is formed on the inner wall of the hole 87.

After that, the silicon nitride film at the bottom of the hole 87 is removed by, for example, dilute hydrofluoric acid treatment, then a semiconductor film (e.g. a silicon film) that forms the channel body of the selection transistor is deposited in the hole 87, and the upper portion of the silicon film is removed.

Figures 16A, 16B, 16C:
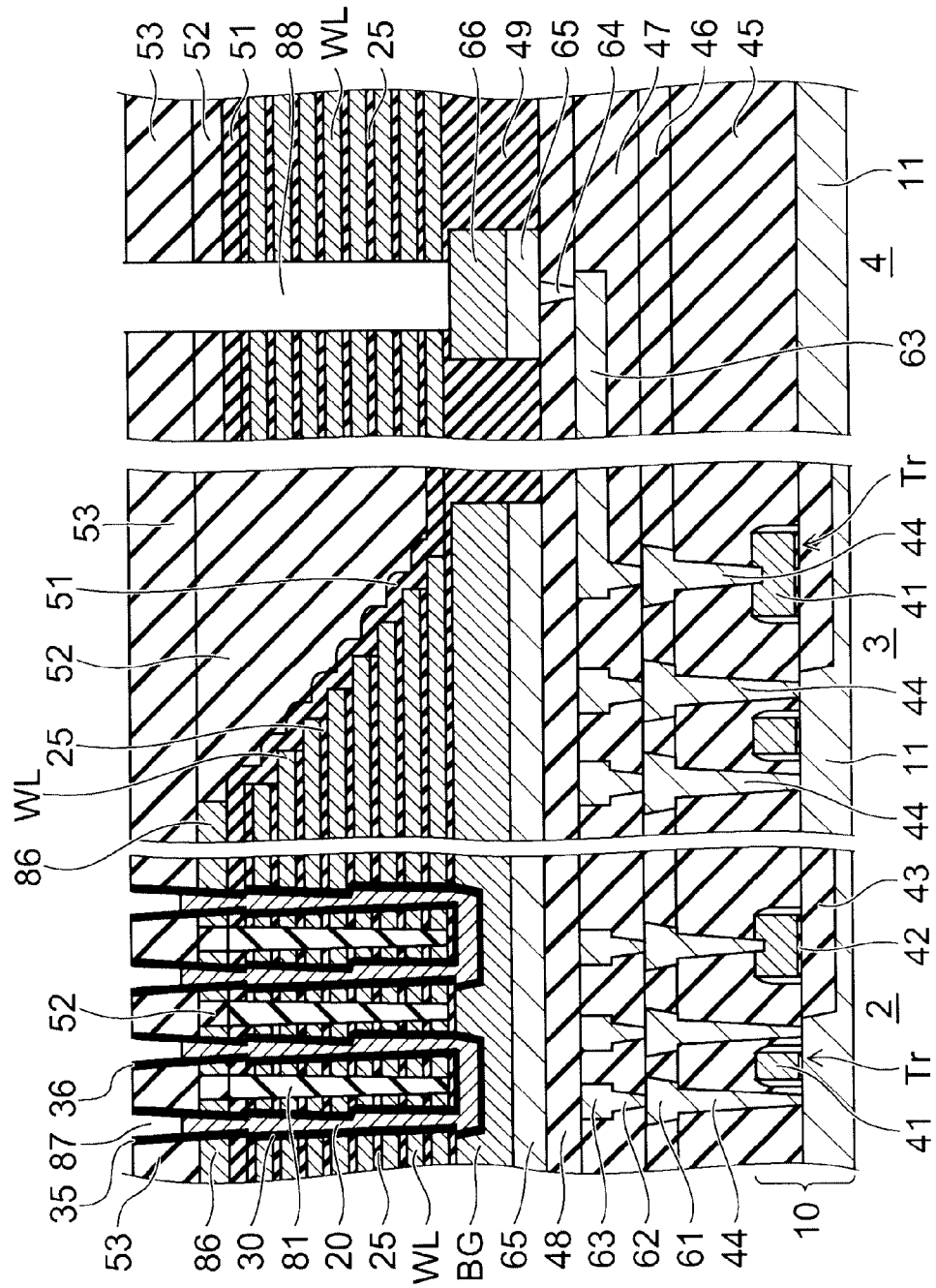

Next, as illustrated in FIG. 16C, dummy hole 88 is formed in the interconnection region 4. The dummy hole 88 is punched through the interlayer insulating films 53 and 52, the stopper film 51, and the underlying stacked body in the interconnection region 4 to reach the pad 66.

Figures 17A, 17B, 17C:
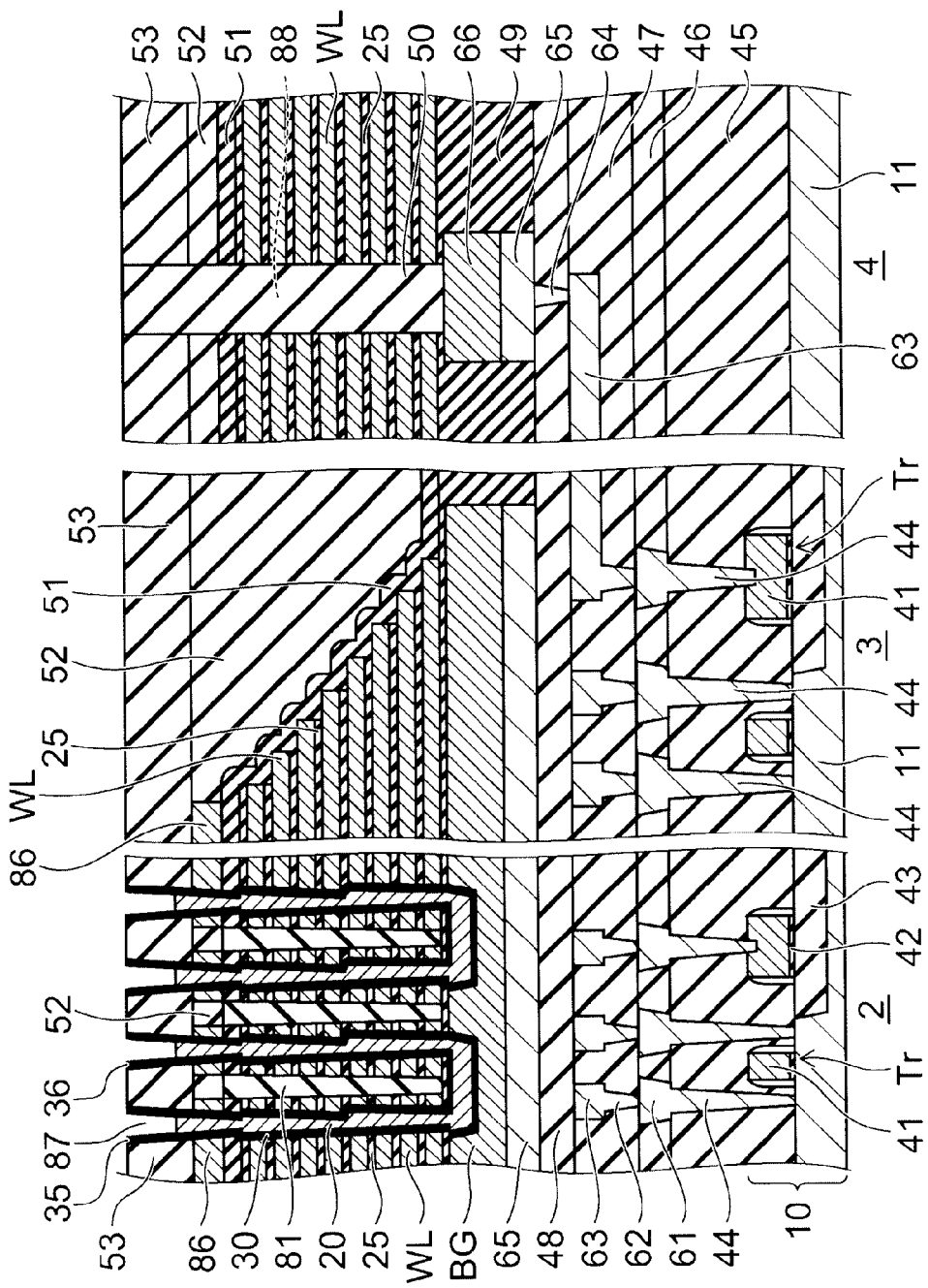

Next, as illustrated in FIG. 17C, the insulator (e.g. a silicon oxide film) 50 is buried in the dummy hole 88.

Next, as illustrated in FIG. 18C, a contact hole 89 punched through the insulator 50 and the pad 66 to reach the metal silicide layer 65 is formed by, for example, the RIE method. Furthermore, as illustrated in FIG. 18B, contact holes 90 to 92 are formed in the staircase-shaped contact region 3 by, for example, the RIE method. The contact holes 90 are punched through the interlayer insulating films 53 and 52 and the stopper film 51 to reach the respective conductive layers WL of the corresponding stairs. Although only one contact hole 90 is illustrated in the drawing, a plurality of contact holes 90 in accordance with the number of conductive layers WL are collectively formed. At this time, the stopper film 51 of a different material from the interlayer insulating film 52 reduces the variation in speed for reaching the conductive layer WL between the plurality of contact holes 90. This suppresses excessive etching of relatively shallow contact holes 90.

The contact hole 91 is punched through the interlayer insulating films 53 and 52, the stopper film 51, the insulating layer 25, and the back gate BG to reach the metal silicide layer 65.

Furthermore, as illustrated in FIG. 18A, an interconnection trench 93 is formed in the interlayer insulating film 53 in the memory cell array region 2.

Figures 19A, 19B, 19C:
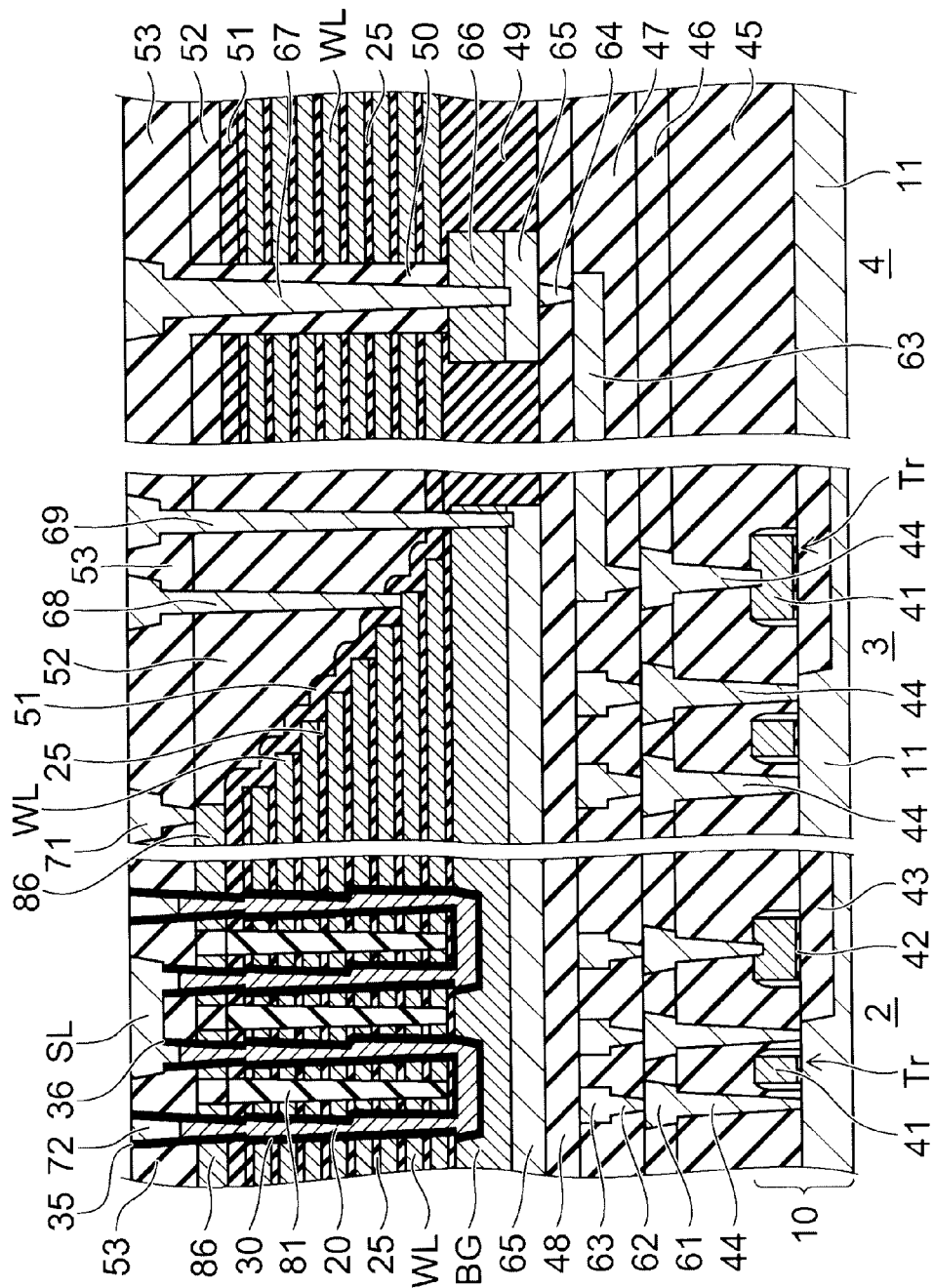

Next, as illustrated in FIGS. 19B and 19C, the contact plugs 67, 68, 69, and 71 are buried in the contact holes 89 to 92, respectively. Further, the contact plug 72 is buried in the hole 87 in the memory cell array region 2, and the source line SL is buried in the interconnection trench 93.

The contact plugs 67, 68, 69, 71, and 72 and the source line SL are formed simultaneously. The contact plugs 67, 68, 69, 71, and 72 and the source line SL include, for example, a titanium film, a titanium nitride film, and a tungsten film formed sequentially from the inner wall side of the hole or the trench.

Figure 2:
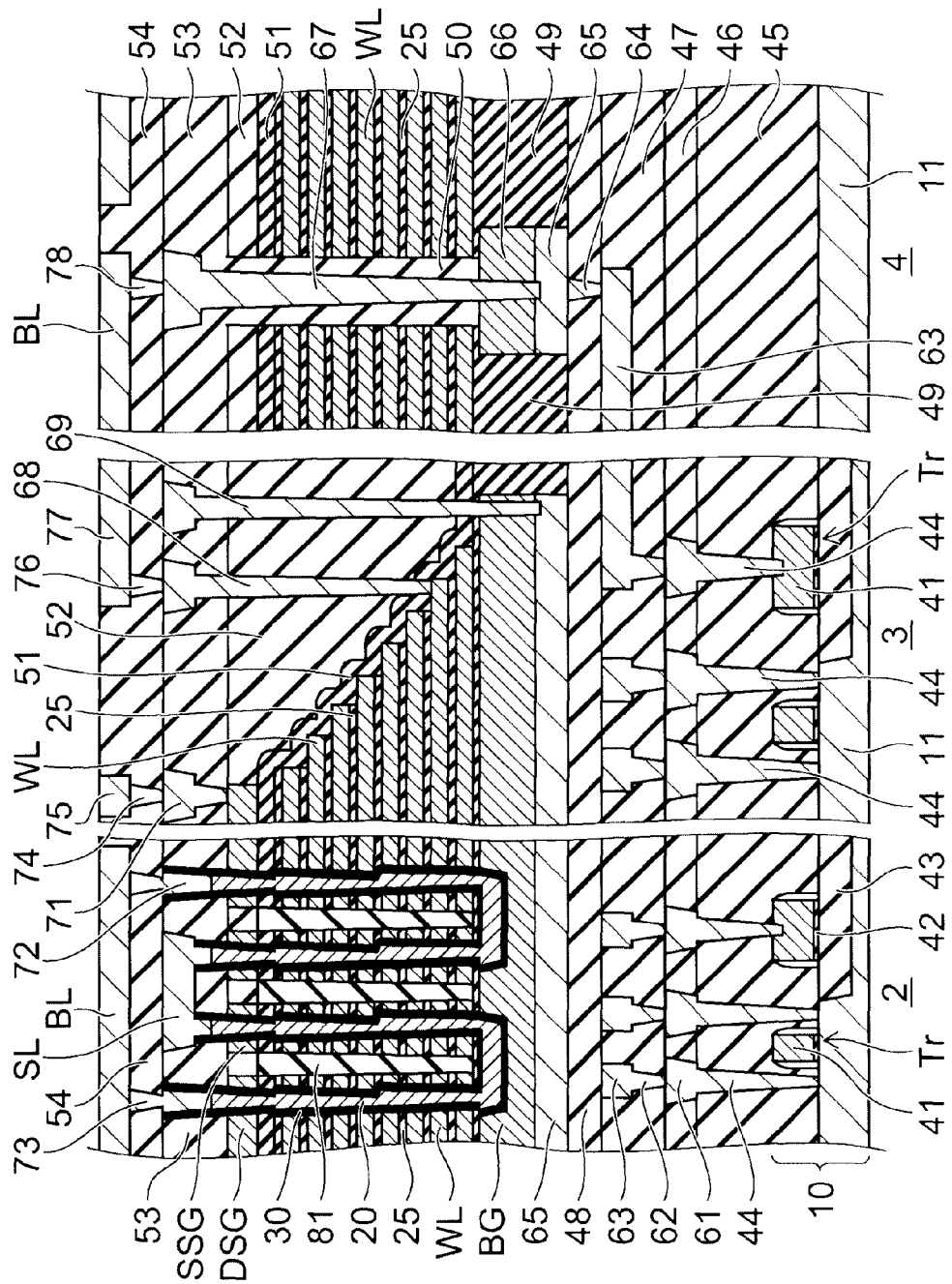
FIGS. 2A to 2C are schematic cross-sectional views of the semiconductor memory device.

Next, as illustrated in FIG. 2, the interlayer insulating film 54 is deposited on the interlayer insulating film 53, and the contact plugs 73, 74, 76, and 78, the bit lines BL, the interconnections 75, and the word lines 77 are formed. An upper portion of the memory string is connected to the bit line BL via the contact plugs 72 and 73. The bit line BL is connected to the sense amplifier 6 formed on the surface of the substrate 11 via the contact plugs 78 and 67 provided in the interconnection region 4, the pad 66, the metal silicide layer 65, the contact plug 64, the interconnection 63, the contact plug 62, the interconnection 61, and the contact plug 44.

The drain side selection gate DSG is connected to the interconnection 75 via the contact plugs 71 and 74. The source side selection gate SSG is connected to the interconnection 75 via the contact plugs 71 and 74. Each conductive layer WL is connected to the word line 77 via the contact plugs 68 and 76.

Figure 21:
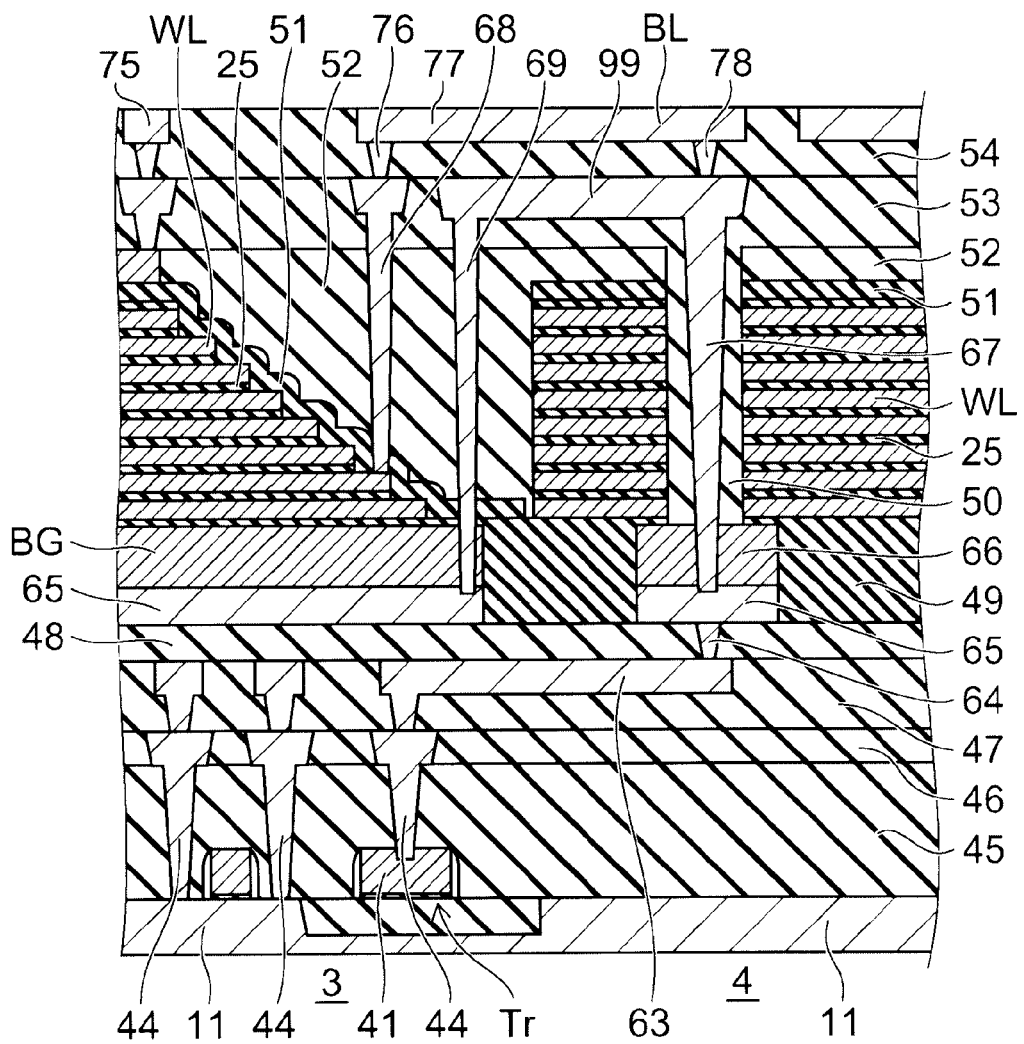
FIG. 21 is a schematic perspective view of the memory cell array of a semiconductor memory device according to still another embodiment.

As illustrated in FIG. 21, the contact plug 67 may be connected to the contact plug 69 connected to the back gate BG in the staircase-shaped contact region 3. That is, the back gate BG is electrically connected to the peripheral circuit formed on the surface of the substrate 11 via the contact plug 69, an interconnection 99 provided above the stacked body mentioned above, the contact plug 67 in the interconnection region 4, the pad 66, the interconnection 63 provided below the stacked body, and the like.

Figure 22:
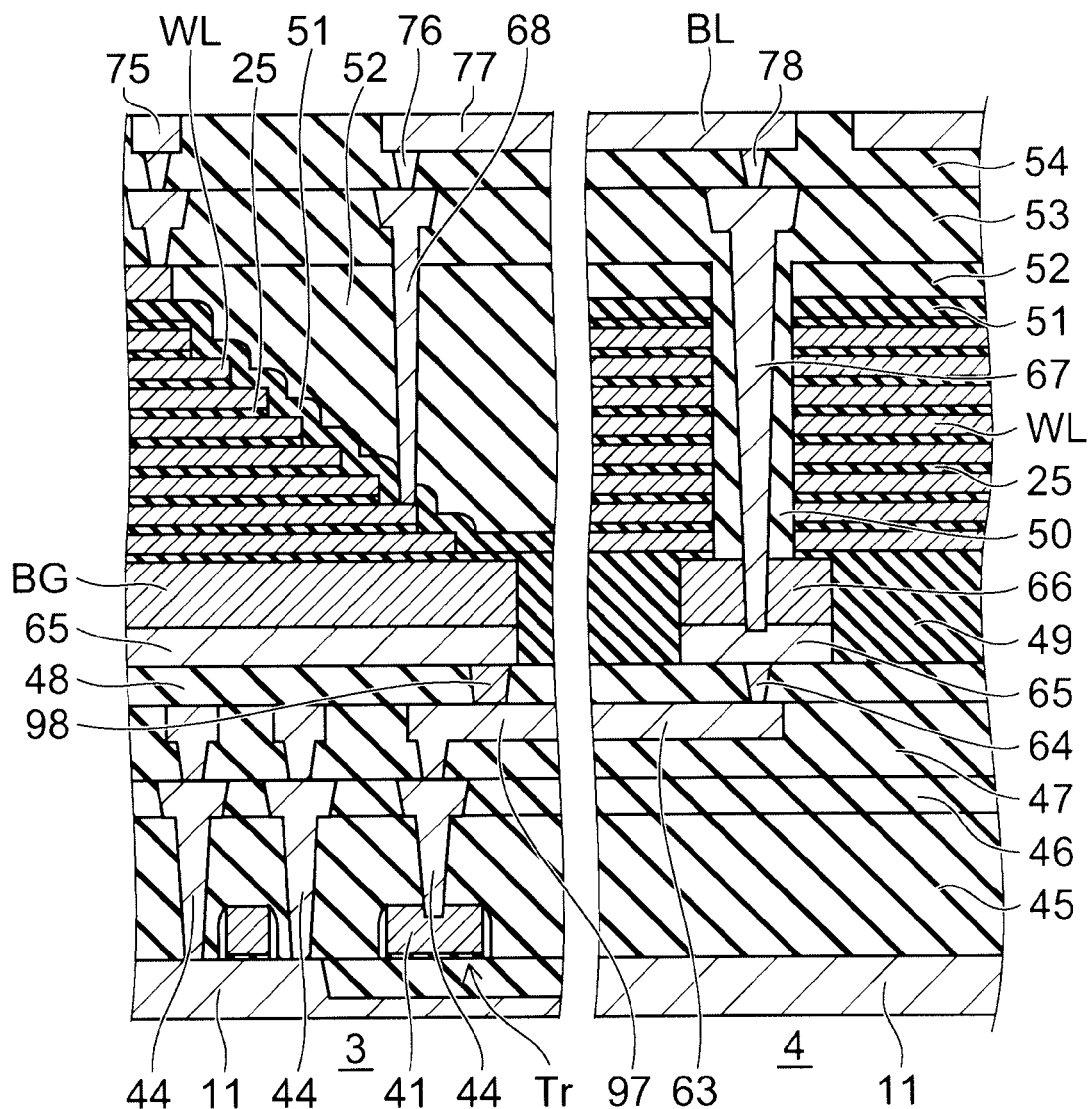
FIG. 22 is a schematic perspective view of the memory cell array of a semiconductor memory device according to still another embodiment.

Alternatively, as illustrated in FIG. 22, the back gate BG and the underlying metal silicide layer 65 in the staircase-shaped contact region 3 may be connected to an underlying interconnection 97 via a plug 98 provided below the stacked body in the staircase-shaped contact region 3. That is, the back gate BG is electrically connected to the peripheral circuit formed on the surface of the substrate 11 via the metal silicide layer 65, the plug 98, the interconnection 97, and the like.

Figure 20:
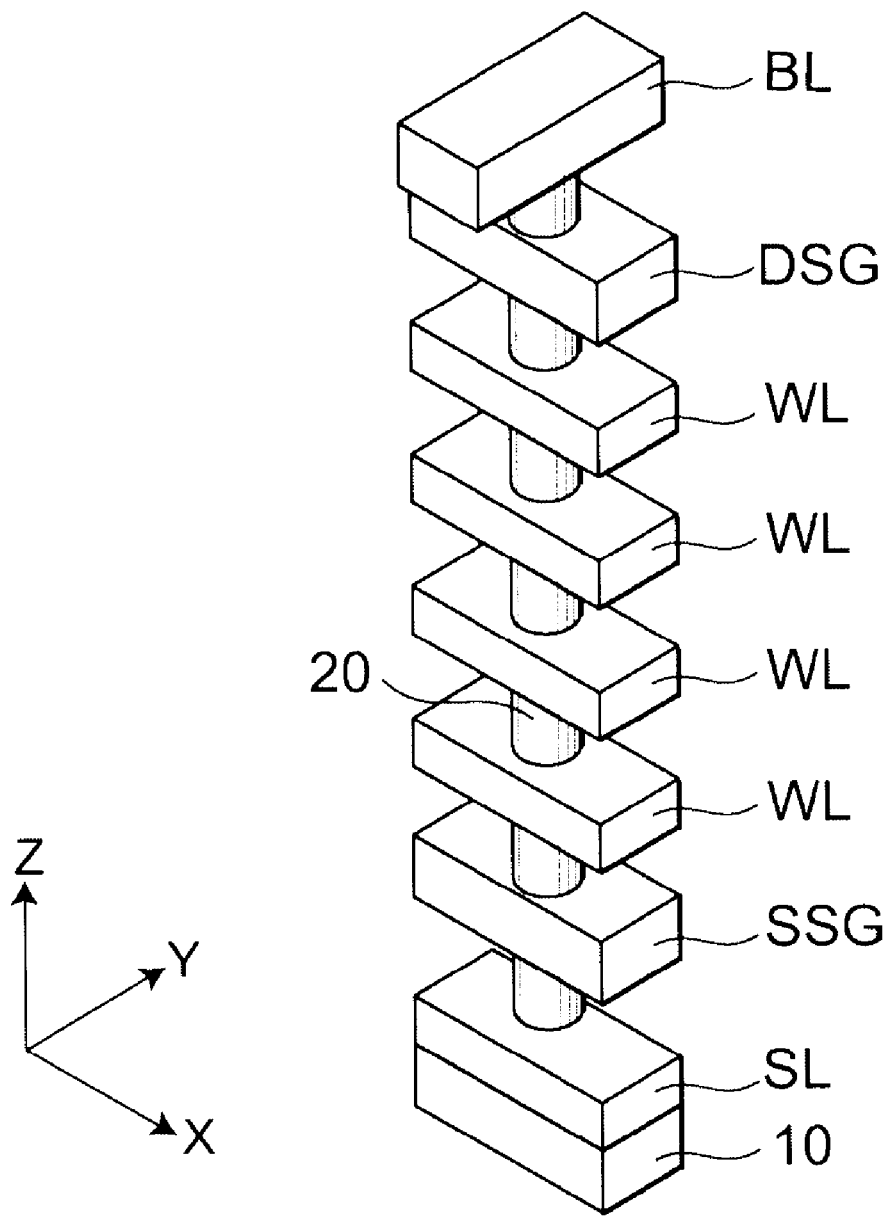
FIG. 20 is a schematic perspective view of the memory cell array of a semiconductor memory device according to another embodiment.

The memory string is not limited to the U-shaped configuration but may be in an I-shaped configuration as illustrated in FIG. 20. FIG. 20 illustrates only electrically conductive portions and omits illustration of insulating portions. In this configuration, the source line SL is provided on the base 10; the source side selection gate (or a lower selection gate) SSG is provided thereabove; the plurality of conductive layers WL are provided thereabove; and the drain side selection gate (or an upper selection gate) DSG is provided between the uppermost conductive layer WL and the bit line BL.

In the embodiments described above, part of the back gate BG, which is the lowermost conductive layer in the stacked body including a plurality of conductive layers (the source line SL, the drain side selection gate DSG, the source side selection gate SSG, the conductive layers WL, and the back gate BG) in which the memory string is formed, is used as the pad 66 in the interconnection region 4. Similarly, also in the case of the configuration illustrated in FIG. 20, part of the source line SL, which is the lowermost conductive layer, may be used as a pad in the interconnection region 4.

While certain embodiments have been described, these embodiments have been presented by way of example only, and are not intended to limit the scope of the inventions. Indeed, the novel methods and systems describes herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

The invention claimed is:
1. A semiconductor memory device comprising:
a base including a substrate and a peripheral circuit formed on a surface of the substrate;
a stacked body including a plurality of conductive layers and a plurality of insulating layers alternately stacked above the base;
a memory film provided on an inner wall of a memory hole punched through the stacked body to reach a lowermost layer of the conductive layers and including a charge storage film;
a channel body provided on an inside of the memory film in the memory hole;
an interconnection provided below the stacked body, and electrically connecting the lowermost layer of the conductive layers in an interconnection region laid out on an outside of a memory cell array region, wherein the memory cell array region having the memory film and the channel body and the peripheral circuit; and
a contact plug piercing the stacked body in the interconnection region to reach the lowermost layer of the conductive layers in the interconnection region; and
wherein the channel body is formed in a U-shaped configuration including: a pair of columns extending in a stack direction of the stacked body; and a connection buried in the lowermost layer of the conductive layers in the memory cell array region and connecting the pair of columns.

2. The device according to claim 1, wherein the lowermost layer of the conductive layers in the interconnection region connected to the contact plug and the interconnection, and the lowermost layer of the conductive layers in the memory cell array region are divided by an interlayer insulating film interposed between the lowermost layer of the conductive layers in the interconnection region and the lowermost layer of the conductive layers in the memory cell array region.

3. The device according to claim 1, further comprising a layer provided above the base, stacked on the lowermost of the conductive layers below the lowermost layer of conductive layers, and containing a metal.

4. The device according to claim 3, wherein
the lowermost layer of the conductive layers is a silicon layer and
the layer containing a metal is a metal silicide layer.

5. The device according to claim 3, wherein the contact plug pierces the lowermost layer of conductive layers in the interconnection region to reach the layer containing a metal.

6. The device according to claim 1, further comprising an insulator provided between the contact plug and the stacked body in the interconnection region.

7. The device according to claim 1, further comprising a bit line connected to the channel body above the stacked body,
the contact plug being connected to the bit line above the stacked body.

8. The device according to claim 1, wherein part of the stacked body on an outside of the memory cell array region is processed into a staircase shape.

9. The device according to claim 8, further comprising:
an interlayer insulating film provided above the portion processed into a staircase shape; and
a plurality of contact plugs piercing the interlayer insulating film to reach the respective conductive layers of corresponding stairs.

10. The device according to claim 1, wherein conductive layers other than the lowermost layer of the conductive layers in the stacked body in the interconnection region are dummy layers not electrically connected to other conductive portions.

11. A semiconductor memory device comprising:
a base including a substrate and a peripheral circuit formed on a surface of the substrate;
a stacked body including a plurality of conductive layers and a plurality of insulating layers alternately stacked above the base;
a memory film provided on an inner wall of a memory hole punched through the stacked body to reach a lowermost layer of the conductive layers and including a charge storage film;
a channel body provided on an inside of the memory film in the memory hole;
an interconnection provided below the stacked body, and electrically connecting the lowermost layer of the conductive layers in an interconnection region laid out on an outside of a memory cell array region, wherein the memory cell array region having the memory film and the channel body and the peripheral circuit;
a contact plug piercing the stacked body in the interconnection region to reach the lowermost layer of the conductive layers in the interconnection region; and
wherein the lowermost layer of the conductive layers in the interconnection region connected to the contact plug and the interconnection is formed as a pad having a larger planar size than a line width of the interconnection.

* * * * *